United States Patent
Shimizu et al.

(10) Patent No.: US 7,977,787 B2
(45) Date of Patent: Jul. 12, 2011

(54) SEMICONDUCTOR DEVICE

(75) Inventors: Kazuhiro Shimizu, Tokyo (JP); Hajime Akiyama, Tokyo (JP); Naoki Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 232 days.

(21) Appl. No.: 12/332,409

(22) Filed: Dec. 11, 2008

(65) Prior Publication Data

US 2009/0096091 A1 Apr. 16, 2009

Related U.S. Application Data

(62) Division of application No. 11/412,990, filed on Apr. 28, 2006, now Pat. No. 7,481,885.

(30) Foreign Application Priority Data

Aug. 26, 2005 (JP) ................................ 2005-245832

(51) Int. Cl.
*H01L 23/48* (2006.01)
*H01L 23/52* (2006.01)
*H01L 29/40* (2006.01)

(52) U.S. Cl. .................. 257/734; 257/773; 257/E21.53; 438/16; 438/323

(58) Field of Classification Search .............. 438/16, 438/323; 257/734, 773, E21.53, E23.01
See application file for complete search history.

(56) References Cited

U.S. PATENT DOCUMENTS

| 5,906,682 | A | 5/1999 | Bouras et al. |
| 6,512,186 | B1 | 1/2003 | Nishiwaki et al. |
| 6,586,780 | B1 * | 7/2003 | Terashima .................... 257/140 |
| 6,713,389 | B2 | 3/2004 | Speakman |
| 6,728,591 | B1 | 4/2004 | Hussey, Jr. et al. |
| 7,327,007 | B2 * | 2/2008 | Shimizu ........................ 257/487 |
| 7,582,946 | B2 * | 9/2009 | Shimizu ........................ 257/501 |
| 2003/0228543 | A1 | 12/2003 | Sawano et al. |
| 2004/0090589 | A1 | 5/2004 | Jung et al. |
| 2004/0212021 | A1 * | 10/2004 | Shimizu ........................ 257/375 |
| 2005/0168235 | A1 | 8/2005 | Arai et al. |
| 2006/0068525 | A1 | 3/2006 | Uehara et al. |

FOREIGN PATENT DOCUMENTS

| DE | 699 38 182 T2 | 2/2009 |
| EP | 1074862 | 2/2001 |
| JP | 2004-276232 | 10/2004 |
| KR | 10 2005 0008 806 A | 1/2005 |
| KR | 10 2006 0051 483 A | 5/2006 |
| WO | WO 01/46708 A1 | 6/2001 |

* cited by examiner

*Primary Examiner* — Phuc T Dang
(74) *Attorney, Agent, or Firm* — Oblon, Spivak, McClelland, Maier & Neustadt, L.L.P.

(57) ABSTRACT

A semiconductor device manufacturing apparatus is provided with a drawing pattern printing part having a print head which injects a conductive solvent, an insulative solvent and an interface treatment solution. The print head is formed in such a way that desired circuit drawing pattern can be printed on a wafer based on information on the drawing pattern from a wafer testing part, information on the wafer from a storage part and coordinate information from a chip coordinate recognition part. In a semiconductor device manufacturing method according to the present invention, a semiconductor device is manufactured by using the semiconductor device manufacturing apparatus in such a manner that desired circuits are formed through printing process. In the semiconductor device, pad electrodes and so on are formed in such a way that trimming process can be conducted by printing circuit drawing patterns.

1 Claim, 27 Drawing Sheets

SEMICONDUCTOR DEVICE

CROSS-REFERENCE TO RELATED APPLICATIONS

This application is a division of U.S. patent application Ser. No. 11/412,990 filed Apr. 28, 2006, now issued as U.S. Pat. No. 7,481,885, and which claims the benefit of priority from prior Japanese Patent Application No. 2005-245832, filed Aug. 26, 2005, the entire contents of both of which are incorporated herein by reference.

FIELD OF THE INVENTION

The present invention relates to a semiconductor device manufacturing apparatus which manufactures a semiconductor device such as a semiconductor integrated circuit, a semiconductor device manufacturing method using the semiconductor device manufacturing apparatus, and a semiconductor device manufactured by using the semiconductor device manufacturing method.

BACKGROUND OF THE INVENTION

In the manufacture of semiconductor integrated circuits (hereinafter abbreviated as ICs), various functions are provided by forming active elements such as CMOSs and bipolar transistors and passive elements such as resistors and capacitors on wafers, and by providing metal wiring which connects them, thereby the process of manufacturing the wafers is completed. After the completion of the wafer manufacturing process, a test to check the quality of IC products, that is, a so-called wafer test is conducted in wafer form before dicing (cutting). In the wafer test, ICs, which have met preset characteristic specifications, are selected, but ICs, which have not met the characteristic specifications, are rejected and thrown away. The characteristic specifications are set in a certain permissible range in consideration of the purpose in the use of ICs and so on.

In recent years, however, to enhance the sensitivity to sensing signals of ICs for sensors or the conversion efficiency of ICs for power conversion, wafer tests to obtain high-quality ICs have been conducted by narrowing the permissible range of the characteristic specifications to the extent possible. But when wafer tests have been conducted by narrowing the permissible range of the characteristic specifications, ICs manufactured by using conventional semiconductor device manufacturing methods have increased in the number of defectives to be rejected, which has resulted in their increased production cost.

Therefore, to produce IC products, which meet the permissible range of the characteristic specifications by adjusting (trimming) the characteristic values of the ICs which have not met the characteristic specifications after the wafer tests, will become a more important and essential technique from now on. Because of this, various "trimming techniques" have been proposed. Typical "trimming techniques" includes "laser trimming" in which part of wiring is cut by using laser beams, "Zener zapping" in which Zener diodes are subjected to avalanche breakdown to form filaments for wiring, "digital trimming" in which digital data is written into memory elements to adjust circuit characteristics, and "wiring formation trimming" in which wiring of electric circuits is newly formed.

Although such various techniques have been proposed as "trimming techniques" used after wafer tests as described above, there is a need to use expense apparatus in trimming process and to form elements and circuits for trimming, which are very likely to become unnecessary, on wafers in advance. As a result, the conventional trimming techniques have caused the problem that the production cost of ICs is increased.

Moreover, in "wiring formation trimming", special drawing patterns are formed in the form of thin films according to the results of wafer tests, and the thin films are affixed to the corresponding spots of the wafers to form wiring for trimming (see, for example, JP-A No. 5-291258). However, in this trimming technique, it is very difficult to form wiring with high accuracy, and high-quality ICs can not be manufactured with high yields.

Furthermore, as "wiring formation trimming", a trimming technique has been proposed in which openings where electrode terminals are exposed are formed on wafers in advance, metal paste is applied to the corresponding openings during trimming to connect the desired electrode terminals with each other, and shielding resin is applied on the connection spots (see, for example, JP-A No. 2004-273679). However, in such conventional "wiring formation trimming", since the metal paste is applied onto the desired electrode terminals in such a way that a certain wide area is covered to form metal paste layers for the formation of electric connection, it has been difficult to perform a fine adjustment. In addition, to prevent the metal paste layers, which have been formed through the application onto the electrode terminals, from peeling and so on, shielding resin layers must be formed on the upper portions of the metal paste layers and hence, ICs have not been easy to manufacture, which has brought about a complex manufacturing process.

SUMMARY OF THE INVENTION

An object of the present invention is to provide a semiconductor device manufacturing apparatus capable of easily forming a desired circuit in a semiconductor device through printing process and a semiconductor device manufacturing method. Moreover, another object of the invention is to provide a semiconductor device manufacturing apparatus, which has a high trimming accuracy and by which the trimming is easily performed, a semiconductor device manufacturing method, and a semiconductor device manufactured by using the semiconductor device manufacturing method.

To attain such objects, a semiconductor device manufacturing apparatus according to the invention includes a wafer testing part which detects characteristics of each chip of a wafer to be tested and determines a drawing pattern for trimming of each chip based on the data detected, a storage part which stores information on the wafer to be tested, and a drawing pattern printing part which forms a desired pattern on each chip of the wafer through printing operation based on information on the drawing patterns from the wafer testing part and the information on the wafer from the storage part, wherein said drawing pattern printing part has a print head which injects at least a conductive solvent, an insulative solvent, and an interface treatment solution, a chip coordinate recognition part which obtains coordinate information of each chip through the image recognition of the wafer, and a control part which controls drawing operation of the print head on the wafer based on the information on the drawing pattern from the wafer testing part, the information on the wafer from the storage part, and the coordinate information from the chip coordinate recognition part. Since the semiconductor device manufacturing apparatus having such a structure forms the drawing patterns according to the test results of the wafer test through the printing operation, it becomes possible to form the drawing patterns with high accuracy and manufacture a high-quality semiconductor device at a high yield.

A semiconductor device manufacturing method according to the invention includes the steps of detecting the characteristics of each chip of the wafer to be tested and determining the drawing pattern for the trimming of each chip based on the detected data, injecting the interface treatment solution to drawn pattern formation regions in the chip surfaces of the wafer based on the information on the determined drawing pattern, and injecting the conductive solvent or the insulative solvent to the drawn pattern formation regions, onto which the interface treatment solution has been injected, based on the determined drawing pattern. In the semiconductor device manufacturing method comprising such steps, the drawing pattern can be formed on the chip surfaces of the wafer through the printing operation with high accuracy, thereby a high-quality semiconductor device can be manufactured at a high yield.

Moreover, a semiconductor device manufacturing method according to another aspect of the invention includes the steps of forming trench portions having a predetermined depth in the drawn pattern formation regions of the wafer, checking whether there is a need to subject the wafer to the trimming, injecting a conductive solvent into the trench portions of the wafer to be subjected to the trimming to draw drawing patterns, conducting degassing and low-temperature annealing after the drawing patterns have been drawn, planarizing the surfaces of the films formed after the degassing and the low-temperature annealing, and conducting high-temperature annealing after the planarization. In the semiconductor device manufacturing method comprising such steps, the drawing patterns can be formed through the printing operation with high accuracy without the occurrence of cracks at the trench portions formed in the drawn pattern formation regions of the wafer.

In a semiconductor device according to the invention manufactured by using the semiconductor device manufacturing apparatus and the semiconductor device manufacturing method according to the invention, the trench portions having the predetermined depth are formed in the drawn pattern formation regions for the trimming of the individual chips of the wafer, the sidewalls of the trench portions are inclined in such a way that the sidewalls have an inclination 5 degrees or more and the opened sides of the trench portions widen, and conductive wiring is formed within the trench portions. In the semiconductor device manufacturing apparatus having such workings, the drawing patterns are easily formed through the printing operation according to the results of the wafer test, thereby the high-quality semiconductor device can be realized which is easily subjected to the trimming process.

Besides, in a semiconductor device according to another aspect of the invention, at least two pad electrodes for trimming exposed from a passivation film are formed at the surface of each chip in wafer form, and then a drawing pattern is formed on the pad electrodes for trimming through printing operation based on a result of a check on the necessity for trimming. In the semiconductor device manufacturing apparatus having such workings, since drawing patterns are formed through the printing operation according to the result of the wafer test, thereby the high-quality semiconductor device can be realized which is easily subjected to the trimming process.

And further, a semiconductor device according to another aspect of the invention has plural cells and is an IGBT chip in which routing wiring is provided and pad electrodes for routing are formed at spots corresponding to the cells. Each cell has a first pad electrode connected to a first electrode but a second pad electrode connected to a second electrode. A drawing pattern is formed between the first electrode and the pad electrode for routing or the second electrode through printing process base on the test results of each cell. In the semiconductor device manufacturing apparatus having such working, trimming can be performed through printing operation according to the test results, which brings the IGBT easily subjected to the trimming process, i.e., the high-quality semiconductor device.

Still further, a semiconductor device according to another aspect of the invention is nonvolatile memory and is formed through printing process in such a way that memory region is covered with an electrostatic shielding film body grounded, following which molding is conducted so as to cover the electrostatic shielding film body. The semiconductor device manufacturing apparatus having such workings makes it possible to prevent the trouble that when such a semiconductor device and a high-withstand voltage element are formed on the same chip together, mold polarization occurs.

Moreover, a semiconductor device according to another aspect of the invention is a high voltage integrated circuit device which is formed by integrating a power semiconductor device and a logic circuit onto one chip. In the high voltage integrated circuit device, conductive wiring, which is level-shift wiring which electrically connects the logic circuit formed inside a high-potential island isolation region and a high-withstand voltage switching element, is formed on a passivation film through drawing pattern printing process. In the semiconductor device manufacturing apparatus having such workings, the level-shift wiring is formed through the drawing pattern printing operation, thereby the semiconductor device can be easily manufactured.

According to the invention, the semiconductor device manufacturing apparatus and the semiconductor device manufacturing method can be provided which makes it possible to easily form a desire circuit in the semiconductor device after the wafer test. Besides, it is possible to provide the semiconductor device manufacturing apparatus, the semiconductor device manufacturing method, and the semiconductor device in which the "trimming technique" can be easily employed after the wafer test. And further, according to the invention, it becomes possible to provide the reliable semiconductor device at low cost.

Moreover, according to the invention, in the formation of the conductive wiring and the insulative film, it is possible to stabilize conduction properties and insulation properties, eliminate troubles such as peeling through the promotion of adhesion between the solvent and the wafer, and enhance insulation properties to adjacent elements and circuit wiring without an increase in chip area while promoting the controllability of the shapes of wiring and films formed.

Furthermore, according to the invention, since desired wiring can be formed on the IC chips after the wafer test without a limitation on the IC chip structure through the use of the versatile techniques, it is possible to obtain the uniform high-quality IC chips. In addition, according to the invention, since faulty chips can be corrected, a fraction non-defective is noticeably increased, thereby the production cost of semiconductor devices can be considerably reduced.

BRIEF DESCRIPTION OF THE DRAWINGS

The present invention will become more fully understood from the detailed description and the accompanying drawings, wherein:

FIG. 24A shows a state of the semiconductor device shown in FIG. 23 represented before a solvent is applied to the semiconductor device, and FIG. 24B shows a state in which the solvent has been applied to the semiconductor device of FIG. 23;

FIG. 26A is a cross-sectional view of the semiconductor device taken along line G-G' of FIG. 25, and FIG. 26B is a cross-sectional view of the semiconductor device taken along line H-H' of FIG. 25;

FIG. 27A is a cross-sectional view of the semiconductor device taken along line G-G' of FIG. 25, and FIG. 27B is a cross-sectional view of the semiconductor device taken along line H-H' of FIG. 25;

DETAILED DESCRIPTION OF THE PREFERRED EMBODIMENTS

Preferred embodiments of a semiconductor device manufacturing apparatus, a semiconductor device manufacturing method, and a manufacturing device according to the present invention will be described below with reference to the accompanying drawings.

First Embodiment

Figure 1:
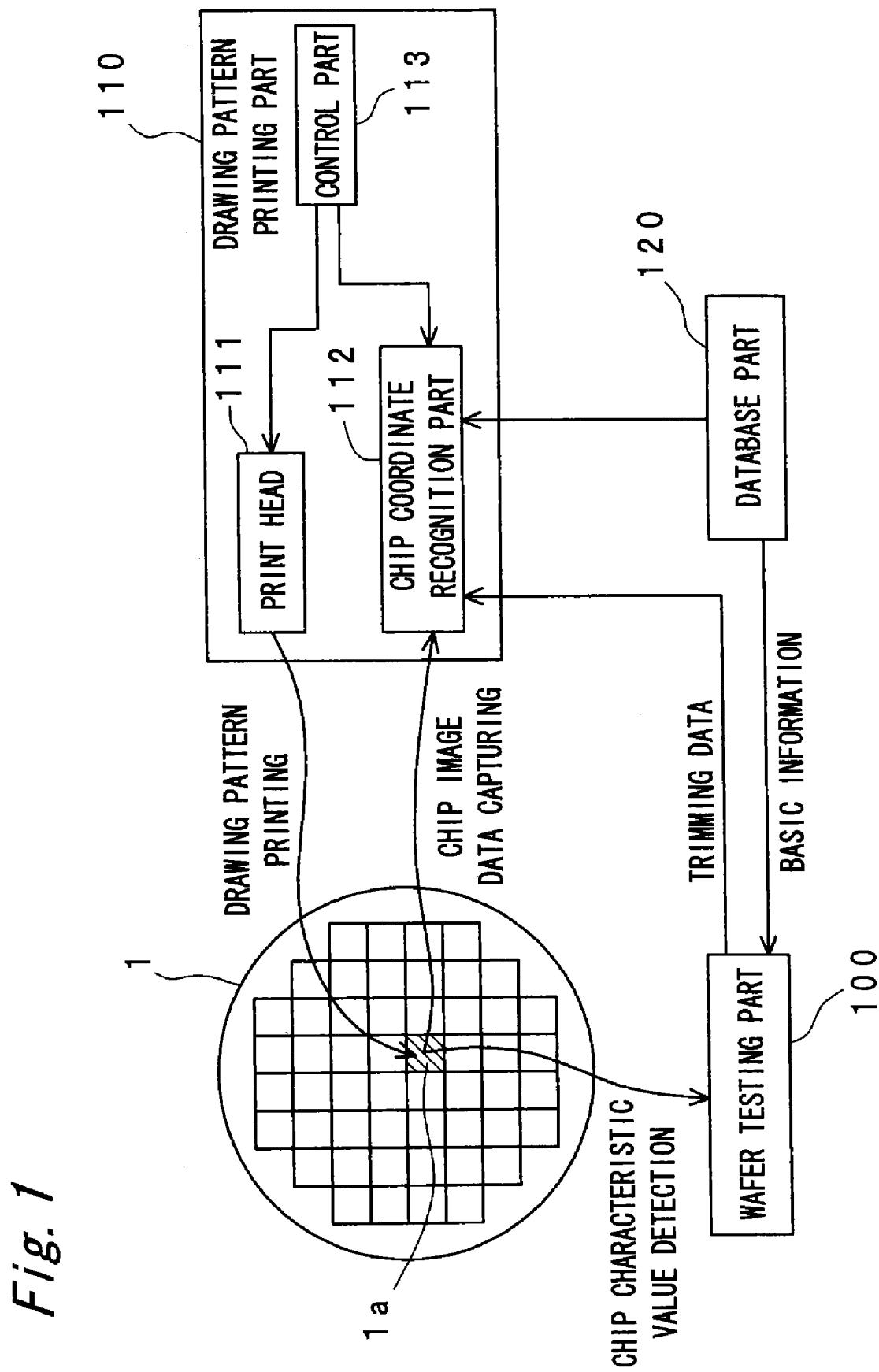
FIG. 1 is a block diagram for showing a configuration of a circuit drawing system of a semiconductor device manufacturing apparatus according to a first embodiment of the present invention.

FIG. 1 is a block diagram for showing a configuration of a circuit drawing system for a semiconductor device manufacturing apparatus of the first embodiment according to the invention. The circuit drawing system for the semiconductor device manufacturing apparatus shown in FIG. 1 is an apparatus used for printing a drawing pattern for the formation of desired circuits on a wafer after a wafer test. A semiconductor device manufactured by the semiconductor device manufacturing apparatus according to the first embodiment is a semiconductor integrated circuit (hereinafter abbreviated as an IC).

The circuit drawing system of the semiconductor device manufacturing apparatus according to the first embodiment has a wafer testing part 100 which measures characteristic values of IC chips mainly being in a wafer state to determine positional data on the IC chips to be trimmed and trimming data such as the trimming amount (drawing pattern) of the IC chips to be trimmed, a drawing pattern printing part 110 which prints the desired circuits on the wafer 1 based on the trimming data determined at the wafer testing part 100, and a database part 120 which is a storage part which stores basic information etc. on the IC chips of the wafer 1.

At the wafer testing part 100, an ordinary wafer test is conducted to detect the data on the individual IC chips of the wafer. The data on the IC chips includes coordinate data, which indicates the positions of the IC chips, and initial characteristic value data obtained from the individual IC chips. Individual pieces of these detected data are related to one another and then recorded at the wafer testing part 100. And further, the basic information on the IC chips, which is stored in the database part 120, is read into the wafer testing part 100 and is compared with the detected initial characteristic value data etc. on the IC chips. The results of the comparisons are stored in a state of being related to the coordinate data on the individual IC chips. At this time, the necessity or unnecessity of the trimming of the IC chips and the drawing pattern of the IC chips requiring the trimming are determined. Incidentally, in the IC chips whose data on the detected initial characteristic values considerably deviates from characteristic specifications to an extent which cannot be adjusted through trimming process, the surfaces of the IC chips are marked with a NG sign in such a way that they can be discerned as defectives in subsequent manufacturing steps.

In the database part 120, the basic information etc. of the IC chips of a wafer of interest is stored in advance. As the basic information etc., there are various drawing patterns used for the trimming corresponding to the detected initial characteristic values, reference image information used for the pattern recognition of the IC chips of the wafer, and printing positional information on the IC chips corresponding to the individual drawing patterns and these items of information are inputted to the database part 120 for storage in advance.

At the drawing pattern printing part 110, the IC chips requiring the trimming are subjected to a drawing pattern printing process based on the trimming data transmitted from the wafer testing part 100. As the trimming data transmitted from the wafer testing part 100 to the drawing pattern printing part 110, there are coordinate data on the IC chips requiring trimming and drawing pattern data representing trimming amounts necessary for the IC chips.

The drawing pattern printing part 110 has a print head 111 which prints the drawing patterns for trimming on the IC chips on the wafer, a chip coordinate recognition part 112 which captures images of the surfaces of the IC chips on the wafer, and a control part 113 which controls the print head 111 based on the various information so as to print the drawing patterns on the surfaces of the IC chips concerned of the wafer.

The chip coordinate recognition part 112 determines the positions of the individual IC chips by capturing the images on the surfaces of the IC chips on the wafer. An image recognition process at the chip coordinate recognition part 112 is conducted by imaging the wafer through image processing using CCDs and recognizing the positions of the individual IC chips through the analysis of the imaging patterns.

The control part 113 obtains the trimming data on the individual IC chips, which are transmitted from the wafer testing part 100, image data on the wafers transmitted from the chip coordinate recognition part 112, and IC chip pattern data and wiring data, etc. about the wafer, which are transmitted from the database part 120. The control part 113 transmits data on the desired drawing pattern used for the trimming of the IC chips concerned of the wafer to the print head 111 and controls the driving of the print head 111. That is, the control part 113 determines printing spot on the wafer based on the image data on the imaging pattern and provides print data to the print head 111. In the print head 111, an inkjet printing system is employed in which the specified drawing pattern can be formed by using a noncontact electronic printing method.

The drawing pattern printing part 110 used in the semiconductor device manufacturing apparatus and the semiconductor device manufacturing method according to the invention will be described in detail below.

Figure 2:
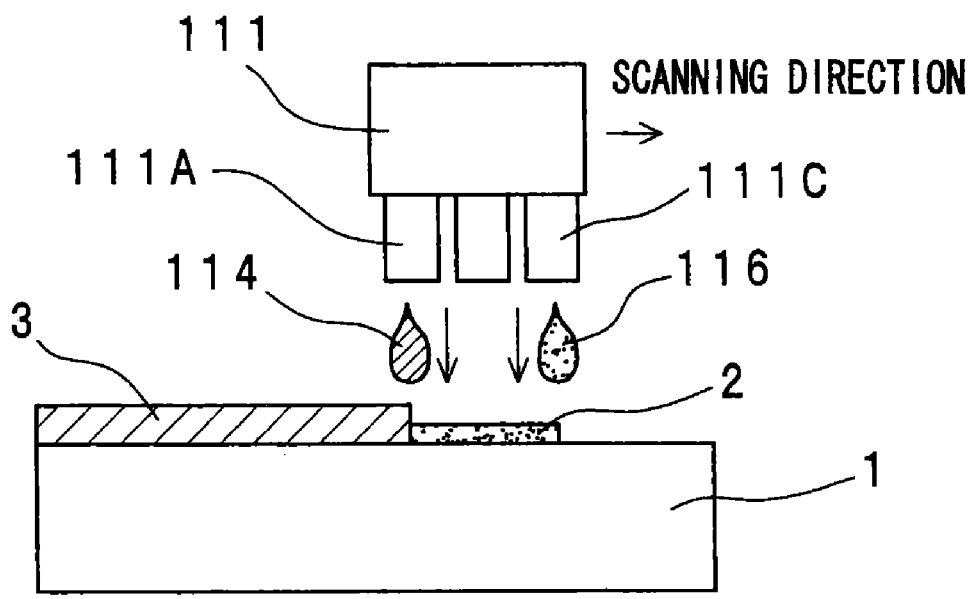
FIG. 2 is an explanatory drawing for showing drawing operation of the print head of the circuit drawing system according to the first embodiment.

FIG. 2 is a drawing for showing a state in which a drawing pattern is formed on the wafer 1 by using the print head 111 of the drawing pattern printing part 110 in the semiconductor device manufacturing apparatus according to the first embodiment. In FIG. 2, individual components are exaggerated in shape for their lucid explanation and, therefore, differ from actual ones in shape. In the explanation described below, the wafer portion having the IC chips which require the trimming based on the result of the wafer test is called a foundation wafer 1.

As shown in FIG. 2, three nozzles 111A, 111B, and 111C are provided to the print head 111 in such a way that they are substantially in the same direction. That is, the three nozzles 111A, 111B, and 111C according to the first embodiment are not only provided in such a way that their injection directions are substantially in parallel with one another but formed integrally. Therefore, they are provided in such a way that when the print head 111 performs scanning operation above the foundation wafer 1 to be trimmed based on the result of the wafer test, the third nozzle 111C first scans, the second nozzle 111B scans along the track of the third nozzle 111C, and the first nozzle 111A lastly scans through the follow of the same track. When the print head 111 performs such scanning operation, a conductive solvent 114 is injected from the first nozzle 111A, an insulative solvent 115 is injected from the second nozzle 111B, and a pretreatment solution 116 is injected from the third nozzle 111C as an interfacial treatment solution.

As shown in FIG. 2, the print head 111 having such a structure is placed above the foundation wafer 1 and scans above the foundation wafer 1 based on a control instruction from the control part 113 to draw a wiring pattern as the desired drawing pattern on the foundation wafer 1. In this drawing operation, the pretreatment solution 116 is first injected from the third nozzle 111C onto the given foundation wafer 1. As the pretreatment solution 116, a surfactant having high affinity for silicon such as a silane coupling agent is used to increase the adhesion of conductive wiring made of the conductive solvent 114 injected from the first nozzle 111A with the surface of the foundation wafer 1. As described above, immediately after the surfactant having such high affinity for silicon is injected from the third nozzle 111C as the pretreatment solution 116, the conductive solvent 114 is injected from the first nozzle 111A along the track of the third nozzle 111C, thereby the desired wiring pattern is drawn on the surface of the foundation wafer 1 with reliability.

Figure 3:
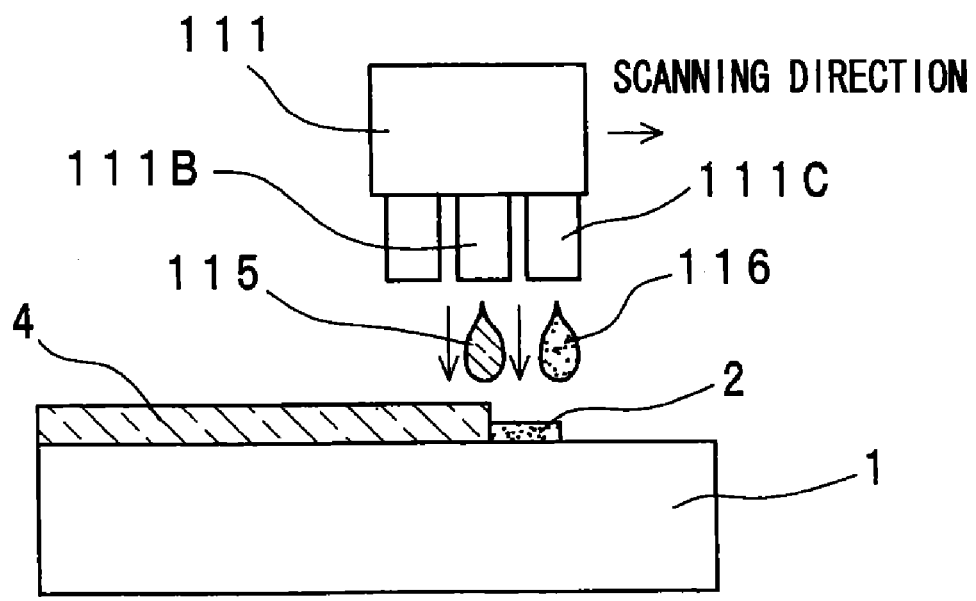
FIG. 3 is an explanatory drawing for showing drawing operation of the print head of the circuit drawing system according to the first embodiment.

Furthermore, as shown in FIG. 3, in the print head 111 according to the first embodiment, a drawing employing an insulative film can be made by using the insulative solvent 115 injected from the second nozzle 111B. The print head 111 is placed above the foundation wafer 1 and scans over the foundation wafer 1 based on a control instruction from the control part 113, thereby a pattern employing a desired insulative film is drawn on the foundation wafer 1. In this drawing operation, the pretreatment solution 116 is first injected from the third nozzle 111C onto the given foundation wafer 1. The pretreatment solution 116 as the surfactant having high affinity for silicon increases the adhesion of the surface of the foundation wafer 1 with the insulative film made of the insulative solvent 115 injected from the second nozzle 111B. As described above, immediately after the surfactant having such high affinity for silicon is injected from the third nozzle 111C as the pretreatment solution 116, the insulative solvent 115 is injected from the second nozzle 111B along the track of the third nozzle 111C, thereby an insulated wiring pattern is drawn on the surface of the foundation wafer 1.

In the semiconductor device manufacturing apparatus according to the first embodiment, the conductive solvent 114 or the insulative solvent 115 is injected on the pretreatment solution 116 immediately after the discharge of the pretreatment solution 116. Therefore, it is possible to suppress change in interfacial properties between the films formed on the foundation wafer 1 resulting from the evaporation of the pretreatment solution 116 and so on, which makes it possible to make any desired drawing.

The drawing size attained by the print head 111 of the semiconductor device manufacturing apparatus according to the first embodiment is about 600 dpi and a line with a desired width above about 43 μm is formed. By using the print head 111, a desired pattern can be also drawn on a passivation film on the IC chip with reliability. Therefore, in the semiconductor device manufacturing apparatus according to the first embodiment, it is possible to form the wiring pattern and the insulated pattern as the desired drawing pattern on the surfaces of the IC chips concerned with reliability, which makes it possible to perform the trimming with high accuracy.

As the conductive solvent 114 injected from the first nozzle 111A, a conductive polymer is used. By using such a conductive polymer, the precise drawing pattern shown in the first embodiment can be formed (printed) with reliability.

In the semiconductor device manufacturing apparatus having such a structure according to the first embodiment, since there is no need to form a structure for special trimming of the individual IC chips of the wafer, it becomes possible to not only considerably reduce the production cost of a semiconductor device but provide a semiconductor device manufacturing apparatus having great versatility.

In a typical printing technique using an inkjet printing system, there are cases where the adhesion of the film body of a print pattern to a foundation is insufficient, so that faulty adhesion, peeling, and so on may be induced by the effect of stress attributed to the uneven surface of the foundation and the increased film thickness of the print pattern. Also, in the inkjet printing system, since there is no step of correcting the nonconformity of the pattern resulting from scattering and so on during injection, it is impossible to correct the nonconformity when the faulty adhesion, the peeling, and so on have developed. Therefore, when a print pattern is formed by using such a typical inkjet printing system, the uneven surface of the foundation and difference in conformability between the film-forming material and the foundation have appeared as are as inconsistency in the print pattern. Furthermore, since the purpose of the typical printing technique using the inkjet printing system is to simply inject a film-forming solvent onto the surface of the foundation for application, the shape of a film formed taking the form of the print pattern has not been controlled.

The circuit drawing system of the semiconductor device manufacturing apparatus according to the first embodiment of the invention is configured to measure the characteristic values of the IC chips taking the form of the wafer, determine the trimming data on the IC chips concerned, and print the desired drawing pattern on the surfaces 1 of the IC chips based on the trimming data. To form such a drawing pattern, the semiconductor device manufacturing apparatus according to the first embodiment is configured to inject the pretreatment solution 116 at the desired line width along the specified drawing pattern through the use of the print head 111 having the special structure and then immediately and surely inject the conductive solvent 114 or the insulative solvent 115 on the line of the pretreatment solution 116 along the track of the drawing pattern formed by using the pretreatment solution 116.

Therefore, in the circuit drawing system of the semiconductor device manufacturing apparatus according to the first embodiment, since the pretreatment solution 116 is injected on the foundation wafer 1 before the drawing pattern is formed by using the conductive solvent 114 or the insulative solvent 115, the uneven surface of the foundation wafer 1 is planarized by the covering of the pretreatment solution 116. As a result, the adhesion of the film body of the drawing pattern formed of the conductive solvent 114 or the insulative solvent 115 with the foundation wafer 1 is constantly excellent. Therefore, since the drawing pattern surely adheres to the surface of the foundation wafer 1, the faulty adhesion, the peeling, and so on are not induced when the film thickness of the drawing pattern has been increased, thereby the reliable circuit drawing system can be realized.

Furthermore, in the circuit drawing system of the semiconductor device manufacturing apparatus according to the first embodiment, the three nozzles are provided parallel with one another and the solvents and so on are successively injected from the nozzles along the same track so as to form the desired line. Because of this, the IC chips concerned can be subjected to the trimming process with high accuracy based on the trimming data obtained after the wafer test, thereby the yield of the wafer can be improved significantly.

As described above, in the circuit drawing system of the semiconductor device manufacturing apparatus according to the first embodiment of the invention, the structure in which the print head 111 has the three nozzles 111A, 111B, and 111C has been explained, but with the print head 111, at least the first and third nozzles 111A and 111C may be formed integrally. In the circuit drawing system having such a structure, the print head 111 scans above the foundation wafer 1 in such a way that the pretreatment solution 116 is injected from the third nozzle 111C in response to the information on the drawing pattern, and the conductive solvent 114 is immediately injected along the track to form conductive wiring 3. At this time, since the surfactant having high affinity for silicon such as a silane coupling agent is used as the pretreatment solution 116, the adhesion of the conductive wiring 3 with the foundation wafer 1 is promoted. Moreover, since the conductive solvent 114 is injected immediately after the pretreatment solution 116 has been injected, it is possible to suppress change in interfacial properties between the foundation wafer 1 and the film formed resulting from the evaporation of the pretreatment solution 116 and so on.

Likewise, in the circuit drawing system of the semiconductor device manufacturing apparatus according to the first embodiment, the print head 111 placed above the foundation wafer 1 may have a structure in which at least the second and third nozzles 111B and 111C are formed integrally. In the circuit drawing system having such a structure, the print head 111 scans above the foundation wafer 1 in such as way that the pretreatment solution 116 is injected from the third nozzle 111C with a timing corresponding to the provision of the information on the drawing pattern and the insulative solvent 115 is immediately injected along the track to form insulative wiring 4. At this time, since the surfactant having high affinity for silicon such as a silane coupling agent is used as the pretreatment solution 116, the adhesion of the insulative film 4 with the foundation wafer 1 is promoted. Moreover, with the insulative solution 115, increased stress associated with the increased film thickness of the solution 115 can be relieved by using, for example, a silicon ladder polymer and at the same time, the occurrence of defects such as cracks can be prevented. In addition, since the insulative solvent 115 is injected immediately after the pretreatment solution 116 has been injected, it is possible to suppress the change in the interfacial properties between the foundation and the film formed resulting from the evaporation of the pretreatment solution 116 and so on.

Second Embodiment

A semiconductor device manufacturing apparatus according to a second embodiment of the invention will be described below. The semiconductor device manufacturing apparatus according to the second embodiment differs from that according to the first embodiment in the structure of the drawing pattern printing part 110 of the circuit drawing system. In particular, they differ in the structure of the print head 111 of the drawing pattern printing part 110. Therefore the print head of the semiconductor device manufacturing apparatus according to the second embodiment is given reference numeral 211 for its explanation. Components other than the print head 211, which have the same functions and structures as those described in the first embodiment, are given the same reference numerals and to the explanation of these components, the explanation made in the first embodiment applies.

Figure 4:
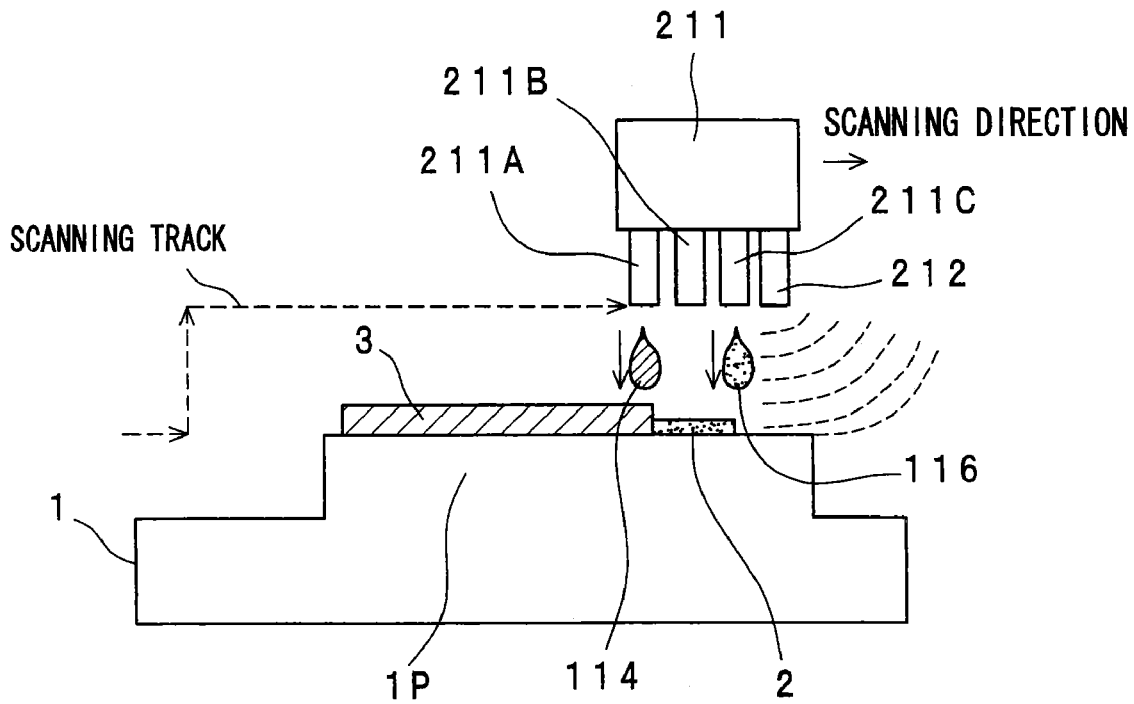
FIG. 4 is an explanatory drawing for showing drawing operation of the print head of the circuit drawing system of a semiconductor device manufacturing apparatus according to a second embodiment of the invention which is performed when a foundation wafer 1 has a convex shape.

Like the circuit drawing system described in the first embodiment, the circuit drawing system of the semiconductor device manufacturing apparatus according to the second embodiment has the wafer testing part 100, the drawing pattern printing part 110, and the database part 120; however, as shown in FIG. 4, the structure of the print head 211 of the drawing pattern printing part 110 is different from that of the print head 111.

Figure 5:
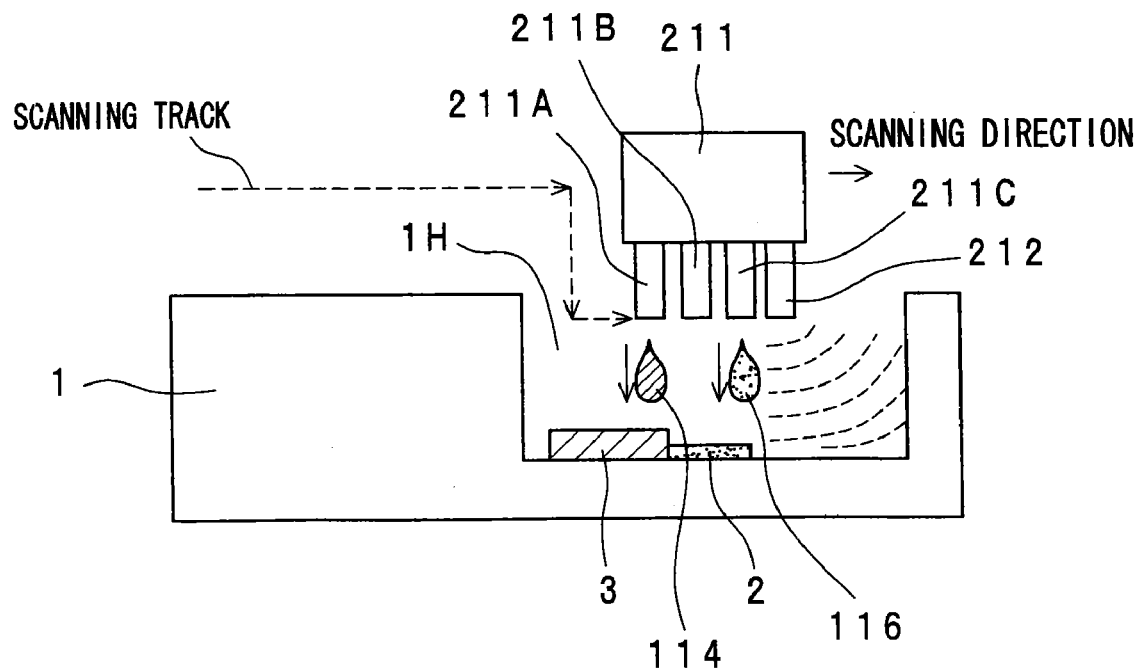
FIG. 5 is an explanatory drawing for showing drawing operation of the print head of the circuit drawing system of the semiconductor device manufacturing apparatus according to the second embodiment of the invention which is performed when the foundation wafer 1 has a concave shape.

FIG. 4 is an explanatory drawing of drawing operation performed in a case where a convex portion 1P is formed at the foundation wafer 1 as a drawn pattern formation region where the conductive wiring 3 or the insulative film 4 is formed by using the circuit drawing system of the semiconductor device manufacturing apparatus according to the second embodiment. FIG. 5 is an explanatory drawing to drawing operation performed in a case where a concave portion 1H is formed at the foundation wafer 1 as a drawn pattern formation region where the conductive wiring 3 or the insulative film 4 is formed by using the circuit drawing system according to the second embodiment.

As shown in FIGS. 4 and 5, the print head 211 of the semiconductor device manufacturing apparatus according to the second embodiment is provided with a first sensor 212 which senses a distance to the surface (print surface) of the foundation wafer 1 in addition to three nozzles 211A, 211B, and 211C. The first sensor 212 is an ultrasonic sensor and senses the distance from the substantial tips of the nozzles of the print head 211 to the print surface of the foundation wafer. As the first sensor 212, a distance detecting element using laser beams may be employed instead of the ultrasonic sensor. Like the nozzles described in the first embodiment, the three nozzles 211A, 211B, and 211C of the print head 211 are not only provided in such a way that their injection directions are substantially parallel with one another but formed integrally in combination with the first sensor 212. Therefore, the nozzles 211A, 211B, and 211C and the first sensor 212 are provided in such a way that when the print head 211 scans over the foundation wafer 1 to be trimmed base on the result of the wafer test, the first sensor 212 senses the distance to the print surface of the foundation wafer 1 first, the third nozzle 211C scans after that, the second nozzle 211B scans along the track of the third nozzle 211C, and finally the first nozzle 211A scans along the track. When the print head 211 scans, the conductive solvent 114 is injected from the first nozzle 211A, the insulative solvent 115 is injected from the second nozzle 211B, and the pretreatment solution 116 is injected from the third nozzle 211C.

As shown in FIGS. 4 and 5, the print head 211 having such a structure is placed above the specified foundation wafer 1 and scans over the foundation wafer 1 based on a command instruction from the control part (see the control part 113 shown in FIG. 1) to draw a desired drawing pattern on the foundation wafer 1. In the drawing operation, the first sensor 212 senses the distance to the print surface of the foundation wafer 1 first and the control part 113 operates to secure a predetermined distance. Then, based on information on the specified drawing pattern, the print head 211 injects the pretreatment solution 116 from the third nozzle 211C onto the drawn pattern formation region of the given foundation wafer 1 to promote adhesion between the surface of the foundation wafer 1 and the conductive wiring made of the conductive solvent 114 injected from the first nozzle 211A. As described above, after the surfactant having high affinity for silicon is injected from the third nozzle 211C as the pretreatment solution 116, the conductive solvent 114 is immediately injected from the first nozzle 211A along the track of the third nozzle 211C, thereby the desired drawing pattern is surely drawn in the drawn pattern formation region of the foundation wafer 1 as the conductive wiring 3.

Incidentally, in FIGS. 4 and 5, the explanation about the case where the conductive solvent 114 is injected from the first nozzle 211A to form the drawing pattern of the conductive wiring 3 on the foundation wafer 1 has been made, but the insulative film 4 can be formed by injecting the insulative solvent 115 after the injection of the pretreatment solution 116. In this drawing operation as well, the first sensor 212 senses the distance to the print surface of the foundation wafer 1 first, the control part 113 operates to secure the predetermined distance, and the desired drawing pattern is surely drawn in the drawn pattern formation region of the foundation wafer 1 as the insulative film 4.

In the circuit drawing system of the semiconductor device manufacturing apparatus according to the second embodiment of the invention, the explanation about the structure in which the three nozzles 211A, 211B, and 211C and the first sensor 212 of the print head 211 are formed integrally has been made, but in the print head 211 placed above the drawn pattern formation region of the convex portion 1P or the concave portion 1H where the drawing pattern should be formed, at least the first sensor 212 can be formed integrally with the first and third nozzles 211A and 211C. In the circuit drawing system having such a structure, the first sensor 212 has the capability of measuring the distance between the print head 211 and the print surface of the foundation wafer 1 through the use of ultrasonic waves, laser beams, or the like. The distance information measured by the first sensor 212 is fed back to the control part (see the control part 113 shown in FIG. 1) to keep the distance between the foundation wafer 1 and the print surface constant, which makes it possible to exercise a stable injection control irrespective of the shape of the foundation wafer 1.

In the circuit drawing system of the semiconductor device manufacturing apparatus according to the second embodiment, the pretreatment solution 116 is injected from the third nozzle 211C based on the information on the drawing pattern, a coating of the pretreatment solution 2 is formed in the drawn pattern formation region, and the conductive solvent 114 or the insulative solvent 115 is injected on the coating of the pretreatment solution 2 to form the desired conductive wiring 3 or the desired insulative film 4. At this time, as the pretreatment solution 116, the surfactant having high affinity for silicon such as a silane coupling agent is used, thereby the adhesion of the conductive wiring 3 or the insulative film 4 with the foundation wafer 1 is promoted.

Moreover, since the conductive solvent 114 or the insulative solvent 115 is injected immediately after the pretreatment solution 116 has been injected, it is possible to suppress change in interfacial properties between the print surface of the foundation wafer 1 and the film formed attributed to the evaporation of the pretreatment solution 116 and so on.

In the circuit drawing system of the semiconductor device manufacturing apparatus according to the second embodiment, the print head 211 can be provided with a structure in which at least the first sensor 212 is formed integrally with the second and third nozzles 211B and 211C. When such a structure is formed, the first sensor 212 measures the distance between the print head 211 and the print surface of the foundation wafer 1 and the distance information is fed back to the control part (see the control part 113 shown in FIG. 1) to keep the distance between the foundation wafer 1 and the print surface constant. And then, the pretreatment solution 116 is injected from the third nozzle 211C based on the information on the specified drawing pattern to form the coating of the pretreatment solution, following which the insulative solvent 115 is injected on the coating of the pretreatment solution to form the insulative wiring 4.

As described above, in the print head 211 of the semiconductor device manufacturing apparatus according to the second embodiment, in addition to the structure in which the three nozzles 211A, 211B, and 211C and the first sensor 212 are formed integrally, the structures in which the first nozzle 211A, the third nozzle 211C, and the first sensor 212 are formed integrally and in which the second nozzle 211B, the third nozzle 211C, and the first sensor 212 are formed integrally may be used; therefore, any of the structures can be selected suitably according to the purpose of its use.

Third Embodiment

A semiconductor device manufacturing apparatus according to a third embodiment of the invention will be described below. The semiconductor device manufacturing apparatus according to the third embodiment differs from that according to the first embodiment in the structure of the drawing pattern printing part 110 of the circuit drawing system. In particular, they differ in the structure of the print head 111 of the drawing pattern printing part 110. Therefore the print head of the semiconductor device manufacturing apparatus according to the third embodiment is given reference numeral 311 for its explanation. Components other than the print head 311, which have the same functions and structures as those described in the first embodiment, are given the same reference numerals and to the explanation of these components, the explanation made in the first embodiment applies.

Figure 6:
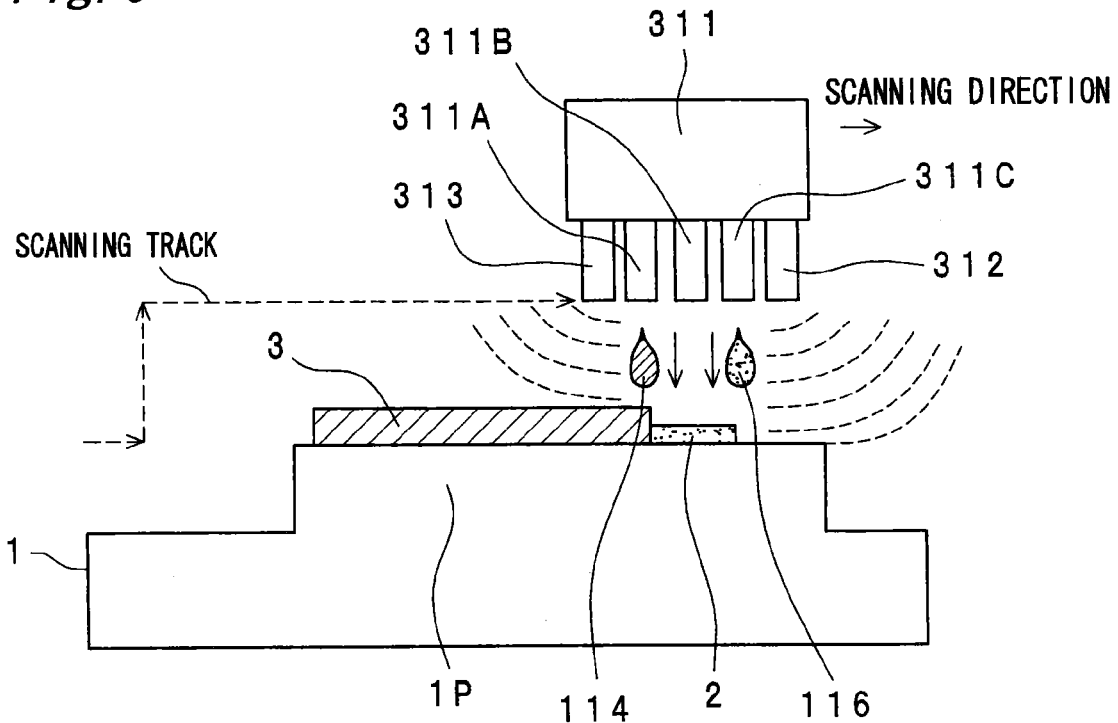
FIG. 6 is an explanatory drawing for showing drawing operation of the print head of the circuit drawing system of a semiconductor device manufacturing apparatus according to a third embodiment of the invention which is performed when the foundation wafer 1 has a convex shape.

Like the circuit drawing system described in the first embodiment, the circuit drawing system of the semiconductor device manufacturing apparatus according to the third embodiment has the wafer testing part 100, the drawing pattern printing part 110, and the database part 120; however, as shown in FIG. 6, the structure of the print head 311 of the drawing pattern printing part 110 is different from that of the print head 111.

Figure 7:
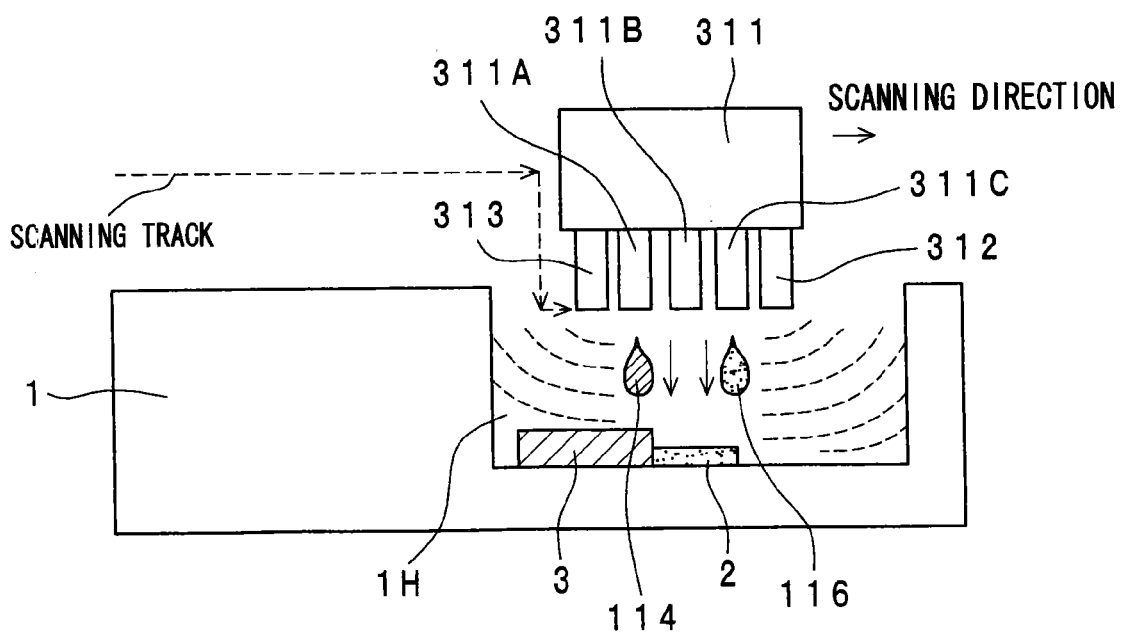
FIG. 7 is an explanatory drawing for showing drawing operation of the print head of the circuit drawing system of the semiconductor device manufacturing apparatus according to the third embodiment of the invention which is performed when the foundation wafer 1 has a concave shape.

FIG. 6 is an explanatory drawing of drawing operation performed in a case where the convex portion 1P is formed at the foundation wafer 1 as the drawn pattern formation region where the conductive wiring 3 or the insulative film 4 is printed by using the circuit drawing system of the semiconductor device manufacturing apparatus according to the third embodiment. FIG. 7 is an explanatory drawing of drawing operation performed in a case where the concave portion 1H is formed at the foundation wafer 1 as the drawn pattern formation region where the conductive wiring 3 or the insulative film 4 is printed by using the circuit drawing system according to the third embodiment.

As shown in FIGS. 6 and 7, the print head 311 of the semiconductor device manufacturing apparatus according to the third embodiment is provided with a second sensor 313 in addition to three nozzles 311A, 311B, 311C and a first sensor 312 which senses the distance to the surface (print surface) of the foundation wafer 1. The second sensor 313 is an ultrasonic sensor and senses a distance to the surface of a solvent injected from the substantial tips of the nozzles of the print head 311, that is, the distance to the substantial surface of the conductive wiring 3 or the insulative film 4. As the second sensor 313, a distance detecting element using laser beams may be used instead of the ultrasonic sensor. The three nozzles 311A, 311B, and 311C of the print head 311 are not only provided in such a way that their injection directions are substantially parallel with one another as in the case of the first embodiment but formed integrally in combination with the first sensor 312 and the second sensor 313. Therefore, when the print head 311 scans over the foundation wafer 1 to be trimmed based on the result of the wafer test, the first sensor 312 senses the distance to the print surface of the foundation wafer 1 first and the third nozzle 311C, the second nozzle 311B, and the first nozzle 311A scan successively along the track of the first sensor 312. And the second sensor 313 is provided so as to finally measure the distance to the surface of the film formed. In the scanning operation of the print head 311, the conductive solvent 114 is injected from the first nozzle 311A, the insulative solvent 115 is injected from the second nozzle 311B, and the pretreatment solution 116 is injected from the third nozzle 311C.

As shown in FIGS. 6 and 7, the print head 311 having such a structure is placed above the specified foundation wafer 1 and scans over the foundation wafer 1 based on a control instruction from the control part (see the control part 113 shown in FIG. 1) to draw a desired pattern on the foundation wafer 1. In such a drawing operation, the first sensor 312 measures the distance (A) to the print surface of the foundation wafer 1, and the print head 311 is controlled so as to sit at a predetermined position. Then the pretreatment solution 116 is injected from the third nozzle 311C to the drawn pattern formation region on the foundation wafer 1 to promote adhesion of the surface of the foundation wafer 1 with the conductive wiring 3 made of the conductive solvent 114 injected from the first nozzle 311A. As described above, after the surfactant having high affinity for silicon as the pretreatment solution 116 has been injected from the third nozzle 311C, the conductive solvent 114 is immediately injected from the first nozzle 311A along the track of the third nozzle 311C, thereby the desired drawing pattern is surely drawn on the drawn pattern formation region of the foundation wafer 1 as the conductive wiring 3.

Moreover, in the circuit drawing system according to the third embodiment, the second sensor 313 measures the distance (B) from the tip of the print head 311 to the substantial surface of the conductive wiring 3 to transmit the measurement information to the control part. The control part detects the film thickness of the conductive wiring 3 from a difference between the measured distances (A) and (B) and exercises control so as to attain a desired film thickness. In this control, the amount of the conductive solvent 114 injected from the first nozzle 311A is controlled.

Incidentally, in FIGS. 6 and 7, the explanation of the case where the conductive solvent 114 is injected from the first nozzle 311A to form the drawing pattern of the conductive wiring 3 on the foundation wafer 1 has been made; however, the insulative film 4 can be formed by injecting the insulative solvent 115 after the injection of the pretreatment solution 116. In this drawing operation as well, the first sensor 312 senses the distance to the print surface of the foundation wafer 1 first, the print head 311 is controlled in such a way that the predetermined distance is kept, and at the same time, the distance (B) from the tip of the print head 311 to the substantial surface of the conductive wiring 3 is measured by the second sensor 313, following which the insulative film 4 is surely drawn on the drawn pattern formation region of the foundation wafer 1 in a desired drawing pattern.

As described above, in the circuit drawing system of the semiconductor device manufacturing apparatus according to the third embodiment of the invention, the print head 311, which scans over the convex portion 1P or the concave portion 1H as the drawn pattern formation region on the foundation wafer 1, has the structure in which at least the first sensor 312 and the second sensor 313 are formed integrally with the three nozzles, i.e., the first nozzle 311A, the second nozzle 311B, and the third nozzle 311C. The first sensor 312 has the function of measuring the distance between the print head 311 and the drawn pattern formation region of the foundation wafer 1 through the use of ultrasonic waves, laser beams or the like. The measured distance information (A) is fed back to the control part and control is exercised to keep the distance between the print head 311 and the foundation wafer 1 constant, thereby stable injection control can be exercised irrespective of the shape of the drawn pattern formation region of the foundation wafer 1.

The circuit drawing system of the semiconductor device manufacturing apparatus according to the third embodiment has the structure in which after the pretreatment solution 116 has been injected from the third nozzle 311C to the drawn pattern formation region based on information on the drawing pattern, the conductive solvent 114 or the insulative solvent 115 is injected to form the conductive wiring 3 or the insulative film 4 on the specified foundation wafer 1. At this time, since the surfactant having high affinity for silicon such as a silane coupling agent is used as the pretreatment solution 116, adhesion of the conductive wiring 3 or the insulative film 4 with the foundation wafer 1 is promoted.

Besides, the circuit drawing system according to the third embodiment has workings in which after the pretreatment solution 116 has been injected, the conductive solvent 114 or the insulative solvent 115 is immediately injected on the pretreatment solution 116, which makes it possible to suppress change in interfacial properties between the film formed and the foundation wafer 1 resulting from the evaporation of the pretreatment solution and so on.

Furthermore, since the circuit drawing system of the semiconductor device manufacturing apparatus according to the third embodiment has workings in which the second sensor 313 emits an ultrasonic wave, a laser beam, or the like to measure the distance between the print head 311 and the surface of the conductive wiring 3 or the insulative film 4, the distance information is fed back with the distance information fed by the first sensor 312, thereby the thickness of the film formed can be surely monitored.

Fourth Embodiment

A semiconductor device manufacturing apparatus according to the fourth embodiment of the invention will be described below. In the semiconductor device manufacturing apparatus according to the fourth embodiment, a concrete example of the conductive solvent, which has been used by the circuit drawing systems of the three pieces of semiconductor device manufacturing apparatus according to the first to third embodiments, will be described. In the following, explanation as to the concrete example will be made with reference to the structure of the semiconductor device manufacturing apparatus according to the first embodiment shown in FIG. 2. Incidentally, the conductive solvent used in the fourth embodiment is applicable to any of the embodiments described above.

The conductive solvent used by the circuit drawing system of the semiconductor device manufacturing apparatus according to the fourth embodiment will be described below.

Figure 8:
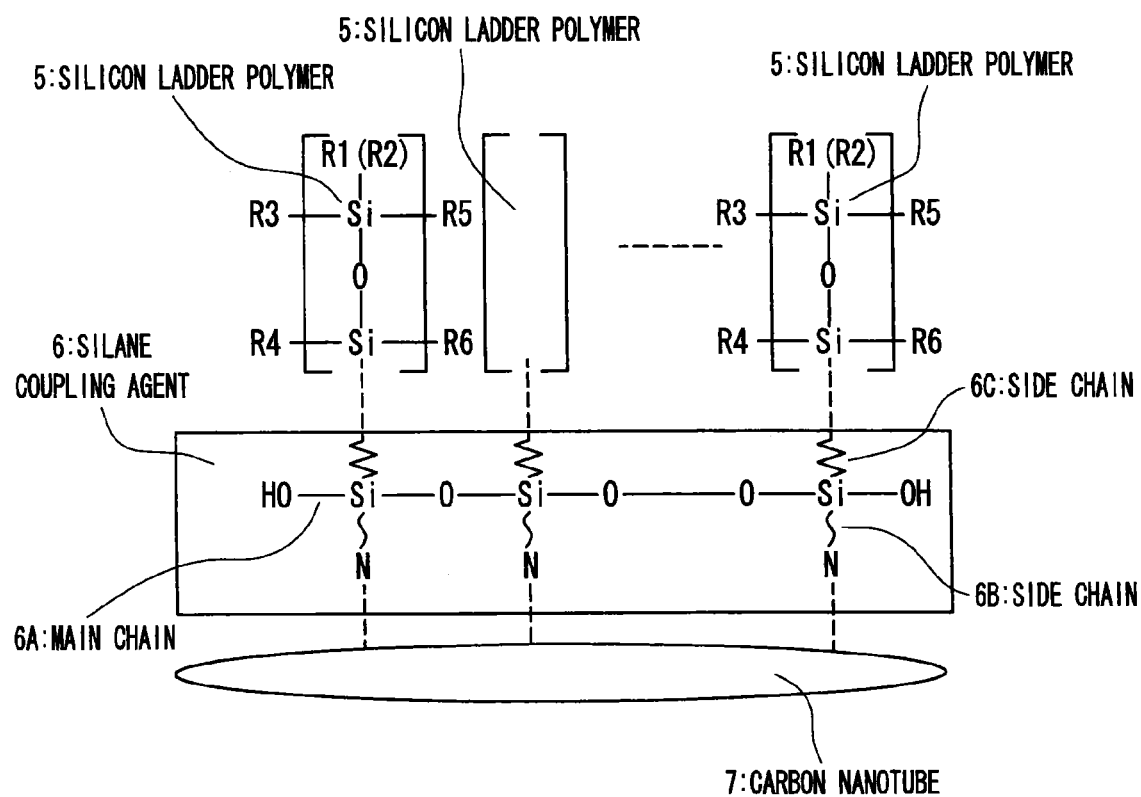
FIG. 8 is a molecular structural drawing for showing an example of a composition of a conductive varnish used in a semiconductor device manufacturing apparatus according to a fourth embodiment of the invention as a conductive solvent 114.

As the conductive solvent 114 used by the semiconductor device manufacturing apparatus according to the fourth embodiment, a conductive viscous varnish is used. FIG. 8 is a molecular structural drawing of an example of a composition of the conductive viscous varnish. In this composition example, carbon nanotubes 7's as a conductive material are evenly dispersed into a silicon ladder polymer 5, i.e., a film-forming base material. As described above, by using the conductive viscous varnish shown in FIG. 8 as the conductive solvent 114, planarity and low stress are attained and interfacial bonding is strengthening by using a silane coupling agent 6 so as to be able to deal with the formation of a thick film.

It is preferable that the carbon nanotube 7 used in the fourth embodiment be highly refined in advance. That is, after its formation using chemical vapor deposition (CVD), it is preferable that the carbon nanotube 7 be additionally annealed in air at a temperature of about 500° C. to 600° C. and impurities such as amorphous carbon be removed by using a centrifugal separator with the nanotube 7 immersed in a mixed solution of a concentrated sulfuric acid and a concentrated nitric acid.

As shown in FIG. 8, the general structural formula of the silicon ladder polymer 5 has the characteristics that a main chain is a Si—O bond and various functional groups can be used as side chains. For example, R1's and R2's are aryl groups, hydrogen atoms, aliphatic alkyl groups, or functional groups having unsaturated bonds and may be of the same type or the different types. R3's, R4's, R5's, and R6's are aryl groups, hydrogen atoms, aliphatic alkyl groups, trialkyl silyl groups, or functional groups having unsaturated bonds and may be of the same type or the different types. In addition, its weight-average molecular weight is above 1000.

The silane coupling agent 6 has a siloxane bond as a main chain 6A, amino groups, which are groups having affinities for carbon nanotubes and which are bonded to the carbon nanotubes 7's as anchor portions, as side chains 6B's, and functional groups, which have the function of developing of an affinity for the silicon ladder polymer 5, such as hydroxyl groups, carboxyl groups, carbonyl groups, ester groups, or polymers made of these functional groups as side chains 6C's.

Through the mixing of the silane coupling agent 6 and the refined carbon nanotubes 7's, their adsorption effects function, which suppresses agglomeration between the carbon nanotubes. Besides, since the affinity between the silicon ladder polymer 5 and the silane coupling agent 6 is high, the carbon nanotubes 7's dispersed evenly in the silane coupling agent 6 diffuse into the silicon ladder polymer 5 without reagglomeration. Moreover, the viscosity of the silicon ladder polymer 5 is adjusted so as to become an optimum viscosity determined by the combination of the inner diameters, injection pressures, etc. of the individual nozzles 111A, 111B, and 111C of the print head 111 (see FIG. 2). The conductive viscous varnish, which is used as the conductive solvent 114 for the semiconductor device manufacturing apparatus according to the fourth embodiment, can be optimized by adjusting the mixing ratio of the organic solvent while keeping the form of the carbon nanotubes 7's dispersed evenly.

When the conductive viscous varnish is used as a viscous solvent, i.e., as the conductive solvent 114 for the semiconductor device manufacturing apparatus according to the fourth embodiment, a film-forming material is used which is made by adding and dispersing into a silicon ladder polymer solution dissolved in an organic solvent a conductive material such as carbon black, carbon nanotubes, or a filler selected from a metal such as silver, copper, nickel, or palladium and oxides of these metals and by adding and dispersing a silane coupling agent into the solution as a finishing agent for the conductive material on an as needed basis.

Next, a wiring drawing operation will be described which is performed by the circuit drawing system using the conductive viscous varnish as the conductive solvent 114 of the semiconductor device manufacturing apparatus according to the fourth embodiment.

Figure 9:
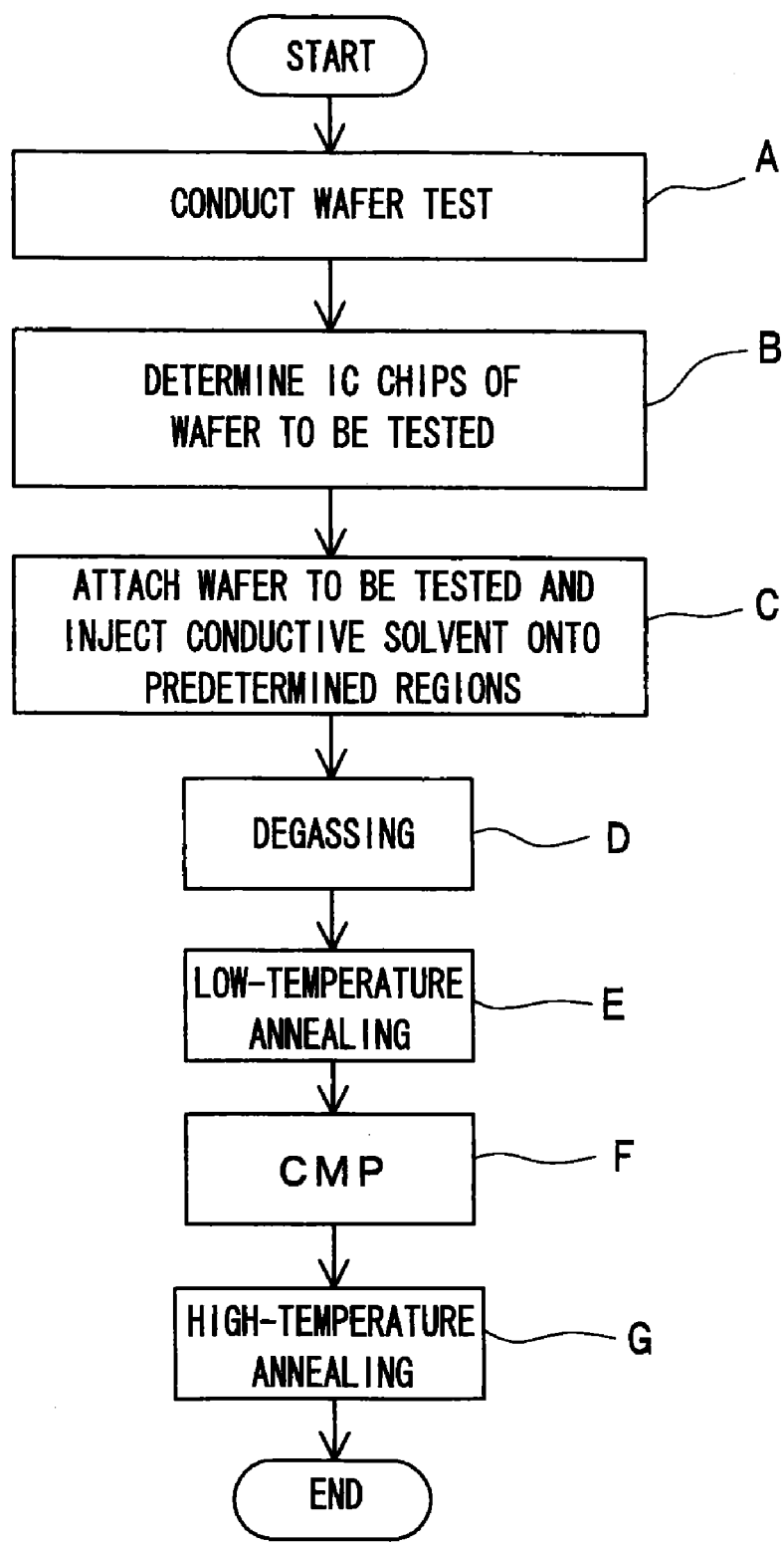
FIG. 9 is a flowchart for showing wiring drawing operation of a circuit drawing system according to the fourth embodiment.

FIG. 9 is a flowchart of circuit drawing operation of the circuit drawing system included in the semiconductor device manufacturing apparatus according to the fourth embodiment. This flowchart showing the circuit drawing operation represents a process in which the conductive solvent 114 is injected according to the specified drawing pattern to form the conductive wiring.

Figure 10:
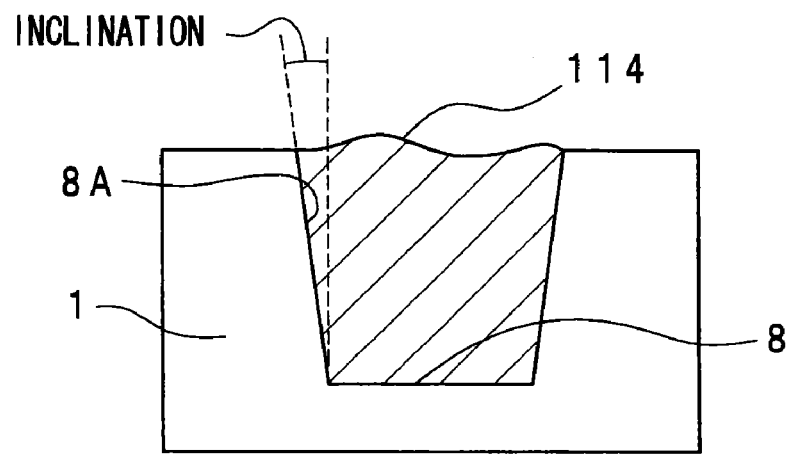
FIG. 10 is a cross-sectional view of a trench portion formed in the foundation wafer 1 used in the circuit drawing system according to the fourth embodiment.
Figure 11:
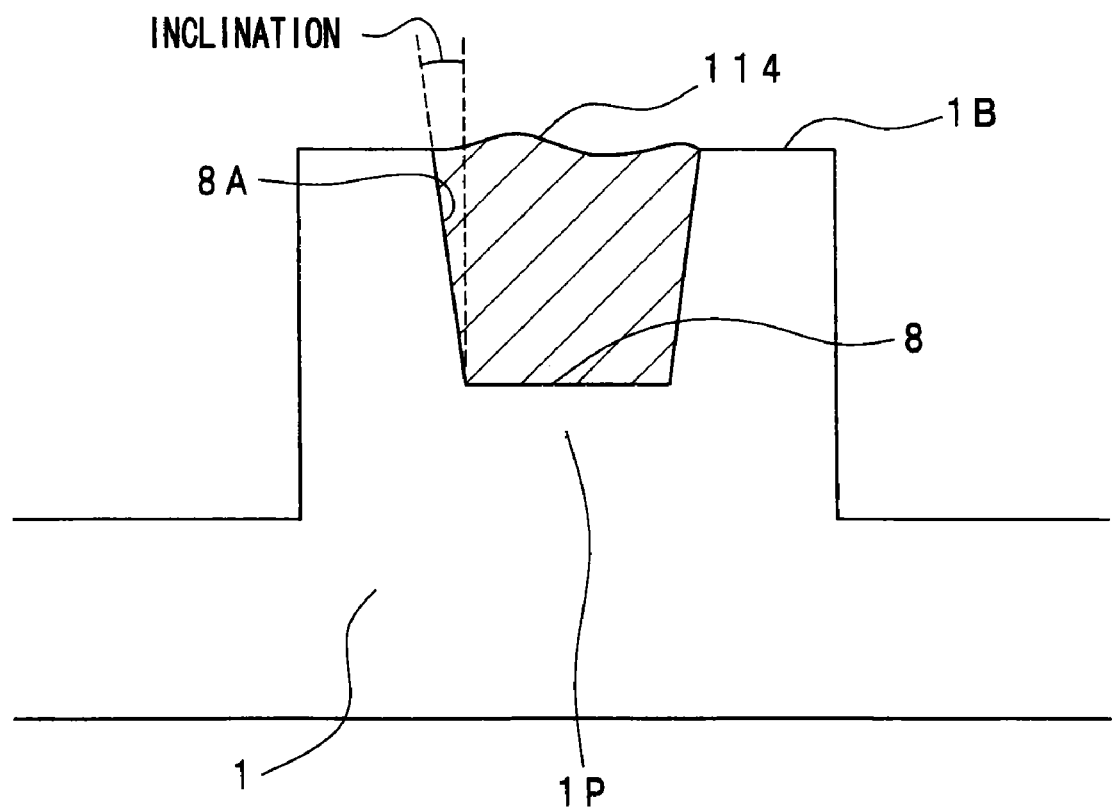
FIG. 11 is a cross-sectional view of a convex portion 1P formed at the foundation wafer 1 used in the circuit drawing system according to the fourth embodiment.

Drawn pattern formation regions where the conductive wiring is formed by the semiconductor device manufacturing apparatus according to the fourth embodiment are shown in FIGS. 10 and 11. FIG. 10 is a cross-sectional view of a trench portion 8 formed in the drawn pattern formation region of the foundation wafer 1. FIG. 11 is a cross-sectional view of a trench portion 8 formed in the convex portion 1P formed in the drawn pattern formation region of the foundation wafer 1. As shown in FIG. 10 or 11, in the semiconductor device manufactured by using the semiconductor device manufacturing apparatus according to the fourth embodiment, the trench portion 8 having a predetermined depth is formed in the drawn pattern formation region.

After a wafer to be tested has been subjected to a wafer test (Step A), IC chips to be trimmed are determined (Step B). Then the IC chips are attached to the circuit drawing system of the semiconductor device manufacturing apparatus according to the fourth embodiment and based on the information on the drawing pattern, the conductive viscous varnish, which contains the silicon ladder polymer 5 as the film-forming base material, is injected into the corresponding trench portion 8 as the conductive solvent 114 (Step C). Immediately after the injection, bubbles and so on of the injected solvent, which have secondarily occurred at the sidewalls and so on of the trench portion 8, are removed by degassing (Step D).

Then the organic solvent is evaporated by low-temperature annealing, for example, exposure to air at a temperature of 100° C. for 15 minutes (Step E). And the surface of the conductive wiring 3 is planarized by CMP (chemical-mechanical polishing) (Step F).

Finally the wafer is hardened by high-temperature annealing, for example, placement in a nitrogen atmosphere at a temperature of 300° C. for 60 minutes (Step G).

In the drawing pattern formed by using such a method, since the silicon ladder polymer 5 as the film-forming base material hardly suffers shrinkage stress, no crack occurs even when a thick film is formed in the trench portion 8 by the filling, thereby the reliable conductive wiring 3 can be formed.

In such a drawing pattern formed by using the circuit drawing system of the semiconductor device manufacturing apparatus according to the fourth embodiment, the occurrence of cracks is prevented even in the case where the conductive wiring 3 is formed within the trench portion 8 as the thick film; in addition to this, the sidewalls of the trench portion formed in the foundation wafer 1 are inclined in such a way that the trench portion 8 widens upward in consideration of the expansion of the conductive material added to the conductive solvent 114.

As shown in FIG. 10, both the sidewall surfaces 8A's of the trench portion 8 are inclined so as to widen upward. It has been shown by the inventors that the inclination of the sidewall surfaces 8A's is preferably in a range of 5 degrees to 10 degrees. It is preferable that the drawing pattern of the trench portion 8 formed in the foundation wafer 1 be fine as long as possible. Therefore, an inclination below 5 degrees is insufficient as an inclination for a region which relieves the expansion of the conductive material added to the conductive solvent 114 and it is preferable to give the inclination of 5 degrees to 10 degrees to secure a sufficient relief region.

As shown in FIG. 10, the trench portion 8 with the inclined sidewall surfaces 8A's is injection filled with the conductive solvent 114 (Step C) and the wafer is subjected to the degassing (Step D), the low-temperature annealing (Step E), the polishing and the planarization (Step F), and the high-temperature annealing (Step G), thereby the desired drawing pattern is formed. Since the sidewall surfaces 8A's of the trench portion 8 shown in FIG. 10 have the inclination of at least 5 degrees in advance, the drawing pattern suffers no damage such as cracks.

Since the silicon ladder polymer itself of the conductive solvent 114 hardly suffers shrinkage stress caused by high-temperature annealing, the apprehension that cracks occur within the trench portion 8 is slight, but there is a need to consider the expansion of the conductive material added to provide the electrical conductivity. Therefore, the inclined sidewall surfaces 8A's are formed at the trench portion 8 shown in FIG. 10 to secure a space for relieving stress caused by the expansion of the conductive material.

Incidentally, in the trench portion 8 shown in FIG. 10, the space for relieving the stress caused by the expansion of the conductive material is formed by giving the inclination to the sidewall surfaces 8A's but if possible at the manufacturing process, it is also possible to form a structure in which only regions close to the surface sides of the sidewall surfaces 8A's of the trench portion 8 are inclined and a structure in which the sidewall surfaces 8A's are curved so as to have the shape of a bow.

When a high-voltage high-amperage current is feed through the conductive wiring 3 of the drawing pattern of a semiconductor device, there is a need to enhance the insulation performance of elements and other wiring portions close to the drawing pattern and to secure insulation distances between them. Therefore, in the circuit drawing system of the semiconductor device manufacturing apparatus according to the fourth embodiment, the construction in which the convex portion 1P in the shape of a mountain top is formed at the surface of the foundation wafer 1 to form the drawing pattern in the top region 1B of the convex portion 1P is used.

FIG. 11 is a cross-sectional view of the convex portion 1P formed at the foundation wafer 1. As shown in FIG. 11, the trench portion 8 is formed in the top surface of the convex portion 1P, i.e., the top region 1B. Both the sidewall surfaces 8A's of the trench portion 8 are inclined in such a way that the trench widens upward. Like the trench portion 8 shown in FIG. 10, it is preferable that the inclination of the sidewall surfaces 8A's be in the range of 5 degrees to 10 degrees. As described above, by forming the trench portion 8 in the top region 1B of the convex portion 1P formed at the foundation wafer 1 for the formation of the drawing pattern, it becomes possible to surely secure insulation distances for elements and other wiring portions close to the drawing pattern. In addition, by forming the drawing pattern in the top region 1B of the convex portion 1P as described above, a construction which meets desired technical specifications can be formed without an increase in the IC chip area.

As shown in FIG. 11, the trench portion 8 is formed in the top region 1B of the convex portion 1P formed at the foundation wafer 1, and the sidewall surfaces 8A's of the trench portion 8 are formed in such a way that the surfaces 8A's are given the predetermined inclination. In the structure shown in FIG. 11, the trench portion 8 formed in the convex portion 1P is injection-filled with the conductive solvent 114 (Step C) and the wafer is subjected to degassing (Step D), low-temperature annealing (Step E), polishing and planarization (Step F), and high-temperature annealing (Step G) to form the desired pattern in the top region 1B of the convex portion 1P. Therefore, as shown in FIG. 11, by forming the drawing pattern at the convex portion 1P as the drawn pattern formation region on the foundation wafer 1, it is possible to secure the insulation distances between the drawing pattern and not only the elements close to the drawing pattern but other wiring portions. Because of this, such a structure is especially useful in a case where a high-voltage high-amperage current is required as the energization condition for conductive wiring.

Incidentally, although the convex portion 1P formed on the foundation wafer 1 may be formed in integration with the foundation wafer 1, yet the convex portion 1P may be formed on the foundation wafer 1 which has been preformed.

In the circuit drawing system of the semiconductor device manufacturing apparatus according to the fourth embodiment, to form the conductive wiring 3 and the insulative film 4 with high accuracy, it is preferable that the diameter of an injection region into which the conductive solvent 114 and the insulative solvent 115 are injected from the nozzles be set at most 30% of the width of the trench portion 8 as the film-forming region or of the width of the top region 1B of the convex portion 1P. By setting the injection region of the viscous solvents as described above, the conductive wiring 3 and the insulative film 4 can be formed in the trench portion 8 or the predetermined region of the convex portion 1P.

Such a value is based on the results of an experiment conducted by the inventors in which the settings of the viscosity and injection pressure of the viscous solvents have been variously changed at the time of the injections of the solvents in consideration of the spread and scattering of the solvents after the injections. There is a need to particularly give consideration to a case where when their film thickness is in the range of the order of several µm to 10 µm, the minimum width of the line of the drawing pattern is 30 µm or more. However, a condition that the conductive wiring 3 and the insulative film 4 be thin and have an extremely narrow width, for example, a condition that the film thickness be 2 µm or less and the minimum width be 5 µm or less can be met by limiting the diameter of the injection region of the conductive solvent 114 and the insulative solvent 115 to 30% to 50% of the width of the film-forming region.

Fifth Embodiment

A semiconductor device manufacturing apparatus according to a fifth embodiment of the invention will be explained below. The semiconductor device manufacturing apparatus according to the fifth embodiment will be described as a concrete example of a case where semiconductor devices are manufactured by using the circuit drawing systems of the three pieces of semiconductor device manufacturing apparatus according to the first to third embodiments. In the following, the explanation will be made by using the structure of the semiconductor device manufacturing apparatus according to the first embodiment shown in FIG. 2, while the manufacture may be conducted by using the two pieces of semiconductor device manufacturing apparatus according to the second and third embodiments. Also, the conductive solvent and the insulated solvent used in the fourth embodiment are applicable to any of the embodiments according to the invention.

In this section on the semiconductor device manufacturing apparatus according to the fifth embodiment, semiconductor devices which have passed the wafer test are trimmed by using the drawing pattern printing part 110 of the circuit drawing system of the semiconductor device manufacturing apparatus according to the first embodiment.

Figure 12A:
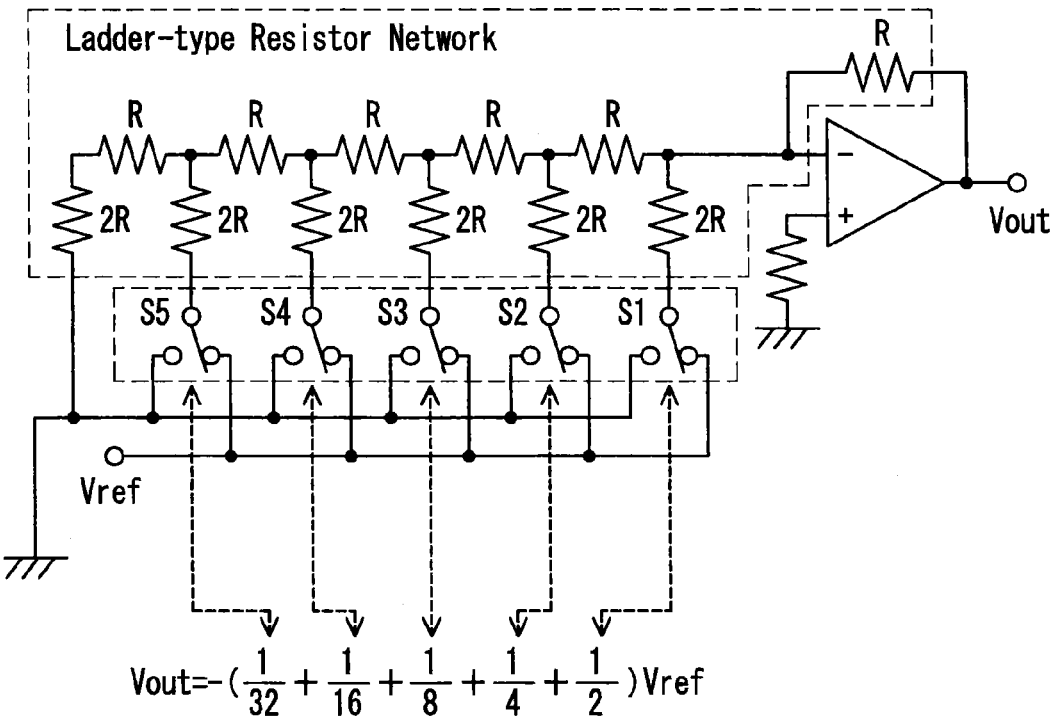
FIGS. 12A and 12B are circuit diagrams for showing the principle of resistance trimming based on R-2R circuit systems having ladder-type resistor networks of semiconductor device manufacturing apparatus according to a fifth embodiment of the invention.
Figure 12B:
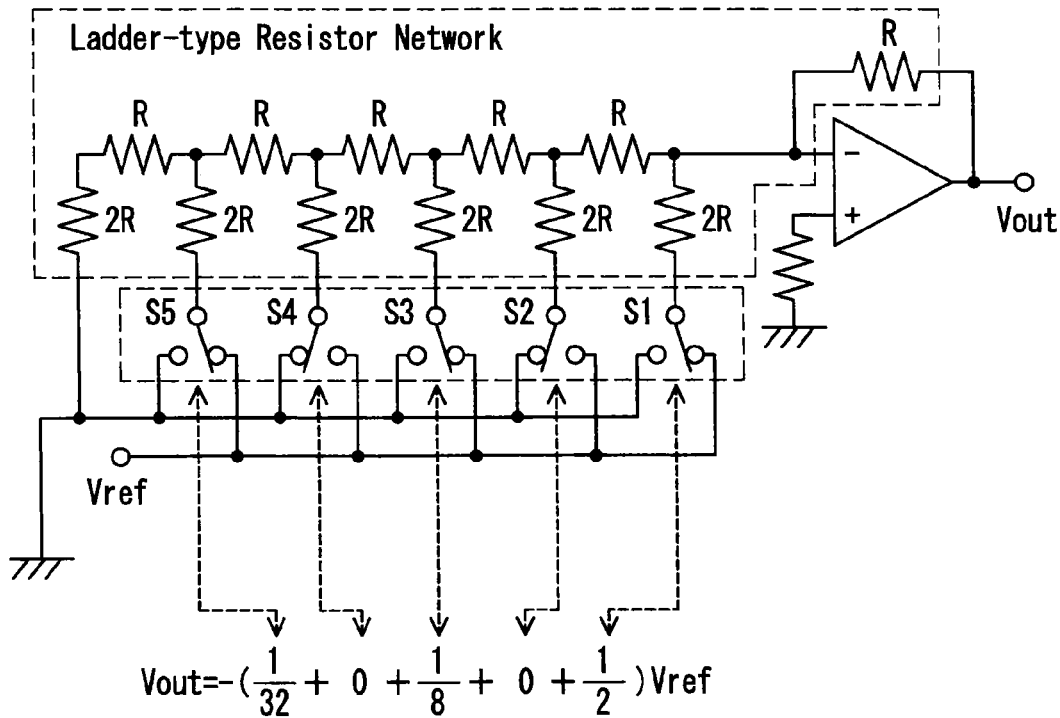

Resistance trimming used at the circuit drawing system according to the fifth embodiment will be briefly described. FIGS. 12A and 12B are circuit diagrams for showing the principle of resistance trimming on a R-2R circuit system having a ladder-type resistor network. In the D-A converter of a semiconductor device shown in FIG. 12A, all trimming regions S1 to S5 corresponding to switches are in an ON state and an output voltage Vout becomes 31/32 of a reference voltage Vref. Besides, the D-A converter of a semiconductor device shown in FIG. 12B is the same as that shown in FIG. 12A. Among the trimming regions S1 to S5 corresponding to switches, the second trimming wiring S2 and the fourth trimming wiring S4 are in an OFF state and the other pieces of trimming wiring S1, S3, and S5 are in the ON state. As a result, the output voltage Vout becomes 31/32 of the reference voltage Vref. As shown in FIGS. 12A and 12B, to set the output voltage Vout at a desired value, a resistance value as a circuit constant is adjusted by subjecting any desired trimming wiring of the trimming regions S1 to S5 corresponding to switches to on-off control (connection/disconnection control), thereby the trimming can be conducted.

Figure 13:
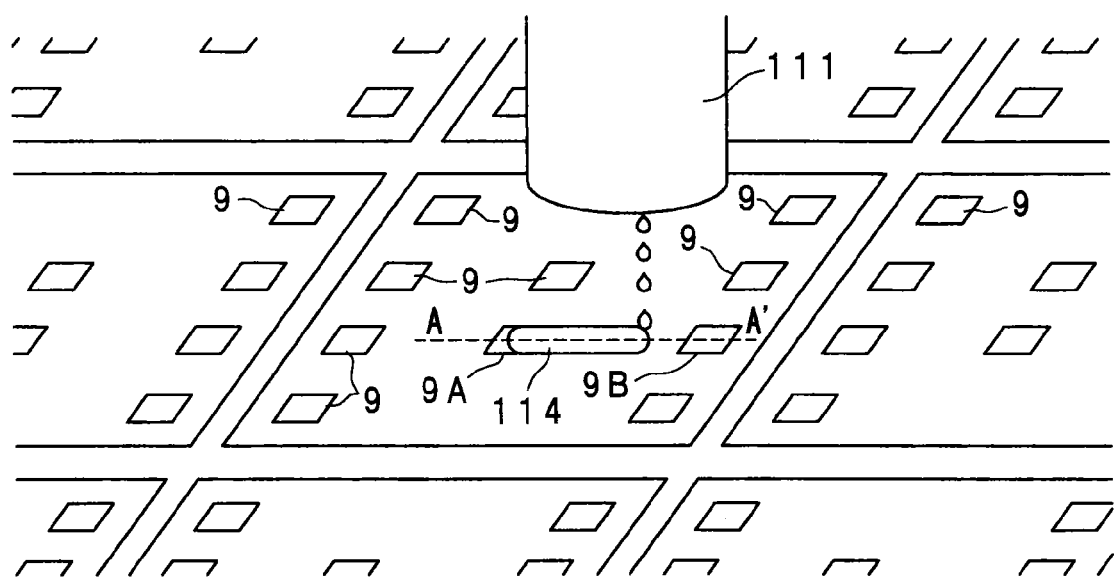
FIG. 13 is a drawing for showing a state in which an IC chip in wafer form is subjected to wiring drawing for trimming at a circuit drawing system according to the fifth embodiment after a wafer test.
Figure 14:
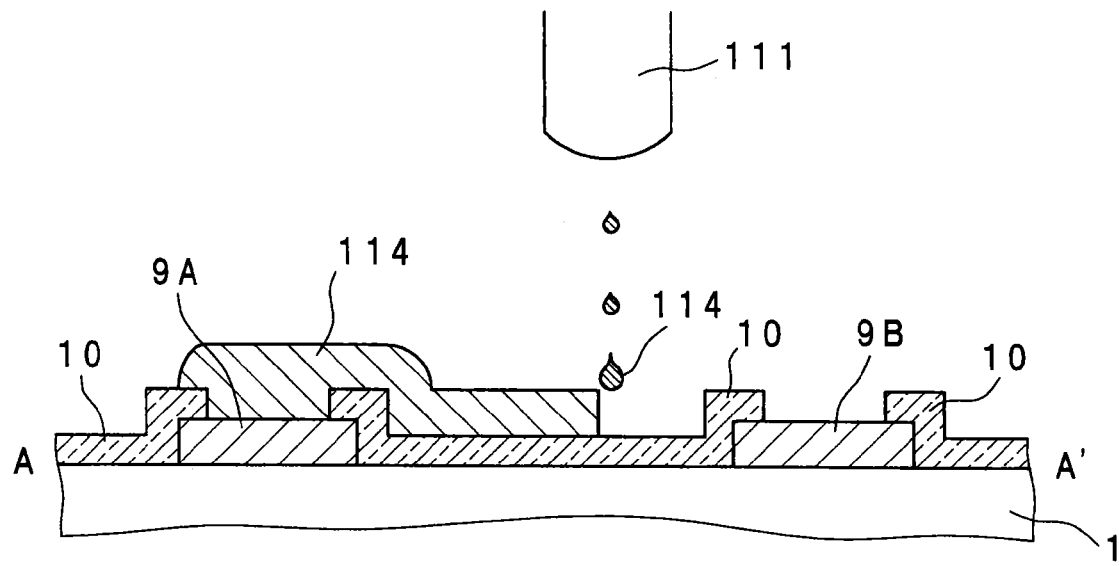
FIG. 14 is a cross-sectional view of the IC chip taken along line A-A' of FIG. 13 to which an injection is conducted from a print head 11.
Figure 15:
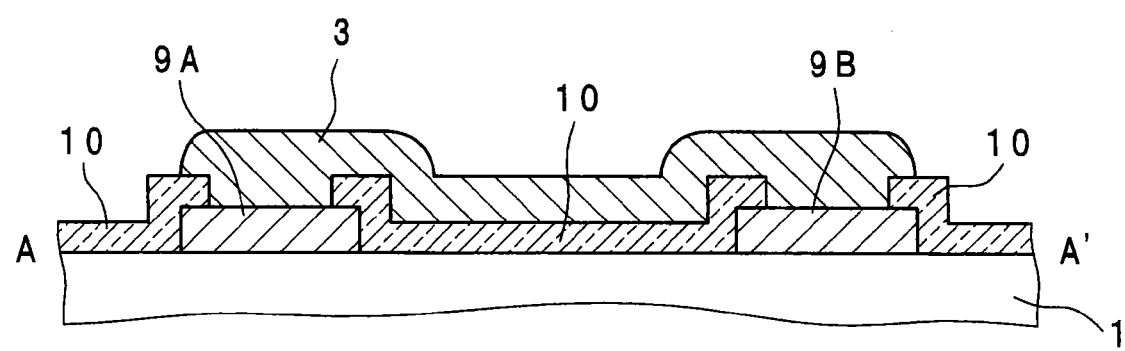
FIG. 15 is a cross-sectional view of a conductive wiring 3 formed between pad electrodes for trimming 9A and 9B by the circuit drawing system according to the fifth embodiment.

FIGS. 13 to 15 are drawings for showing a state in which the IC chips in wafer form is subjected to wiring drawing for trimming at the circuit drawing system according to the fifth embodiment after the wafer test. In these figures, the print head 111 injects the pretreatment solution 116 and the conductive solvent 114 between two specified pad electrodes 9A and 9B among trimming pad electrodes 9's to form the conductive wiring 3. FIG. 14 is a cross-sectional view of the IC chip taken along line A-A' of FIG. 13. In FIG. 14, the print head 111 in an injection state is shown. FIG. 15 is a cross-sectional view for showing a state in which the conductive wiring 3 is formed between the pad electrodes 9A and 9B.

In FIGS. 14 and 15, the trimming pad electrodes 9A and 9B are formed on the top surface of the foundation wafer 1, following which a passivation film 10 is formed in such a way that the top surfaces of the pad electrodes 9A and 9B are exposed. The foundation wafer 1 thus formed after the wafer test is subjected to trimming process at the drawing pattern printing part 110 of the circuit drawing system of the semiconductor device manufacturing apparatus according to the first embodiment.

The pretreatment solution 116 and the conductive solvent 114 are injected from the print head 111 of the drawing pattern printing part 110 to the trimming pad electrodes 9A and 9B on the foundation wafer 1 to form the conductive wiring 3 between the pad electrodes 9A and 9B as the desired drawing pattern. As a result, the pad electrodes 9A and 9B are brought to a state of being electrically connected with each other (ON state) and the specified trimming process is conducted.

In the wiring drawing operation for forming the drawing pattern, such trimming process is conducted based on the trimming data representing the results of the wafer test to form the semiconductor device having characteristic values which fall within desired ranges. During the wiring drawing operation, the conductive solvent 114 is injected between the electrode pads specified based on the trimming data to form the wiring. A printing state effected at this time is 600 dpi (dot per inch) and a resolution above 43 µm can be obtained. Because of this, the wiring can also be drawn on the passivation films on the IC chips.

Therefore, by using the circuit drawing system according to the fifth embodiment, an inexpensive and versatile drawing pattern can be formed without forming a special structure for trimming in IC chips in wafer form. And further, by using the circuit drawing system according to the fifth embodiment, trimming can be conducted with a high degree of reliability.

Sixth Embodiment

A semiconductor device according to the sixth embodiment of the invention will be described below. The semiconductor device according to the sixth embodiment is a semiconductor device which is manufactured by using the semiconductor device manufacturing apparatus according to any one of the first to third embodiments, and which is subjected to trimming process at the drawing pattern printing part 110 of the circuit drawing system based on the trimming data obtained from the wafer test.

Figure 16:
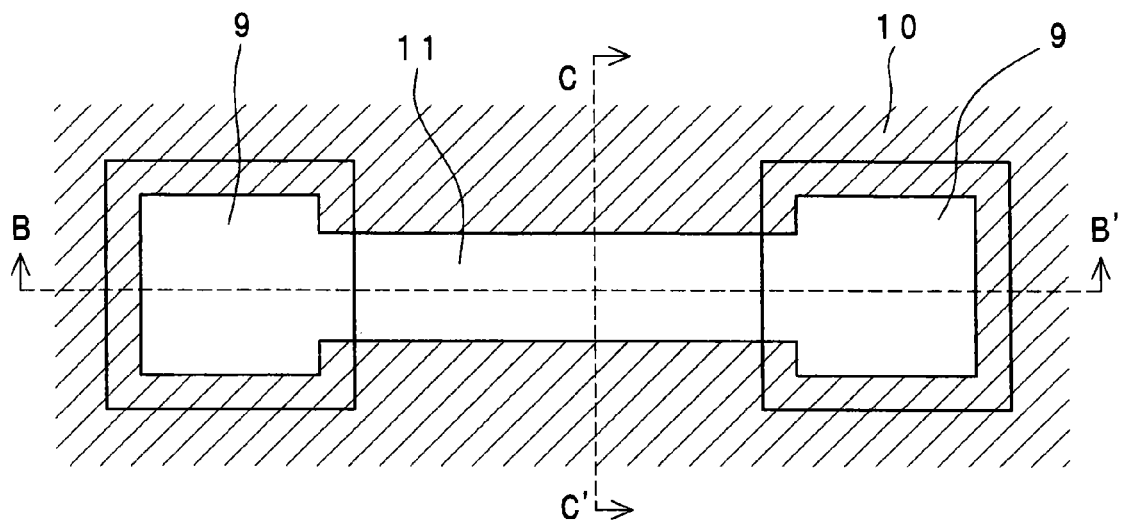
FIG. 16 is a plan view of a semiconductor device including a pair of pad electrodes 9's to be subjected to trimming process at a semiconductor device manufacturing apparatus according to a sixth embodiment of the invention.
Figure 17A:
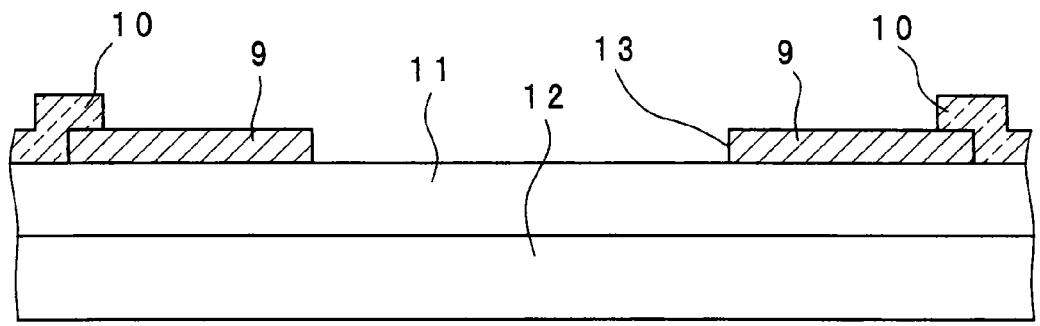
FIG. 17A is a cross-sectional of the semiconductor device taken along line B-B' of FIG. 16
Figure 17B:
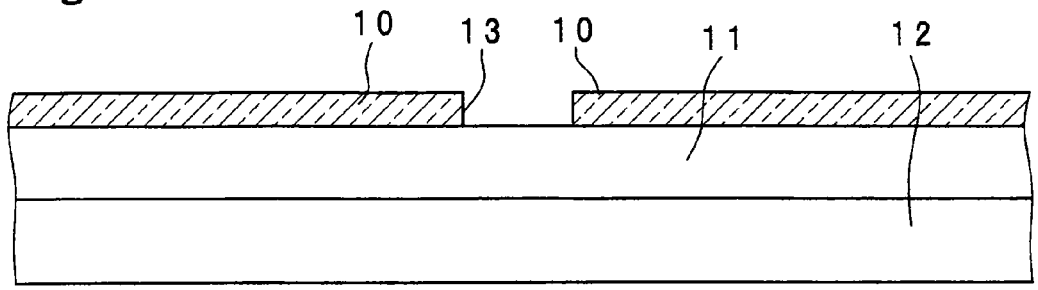
FIG. 17B is the semiconductor device taken along line C-C' of FIG. 16.
Figure 18A:
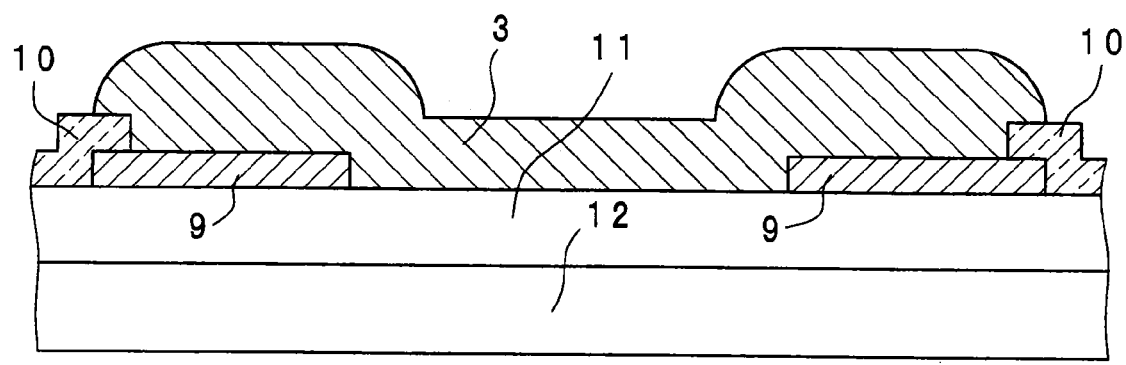
FIG. 18A is a cross-sectional view of the semiconductor device taken along line B-B' of FIG. 16 which is in a state effected after trimming process.
Figure 18B:
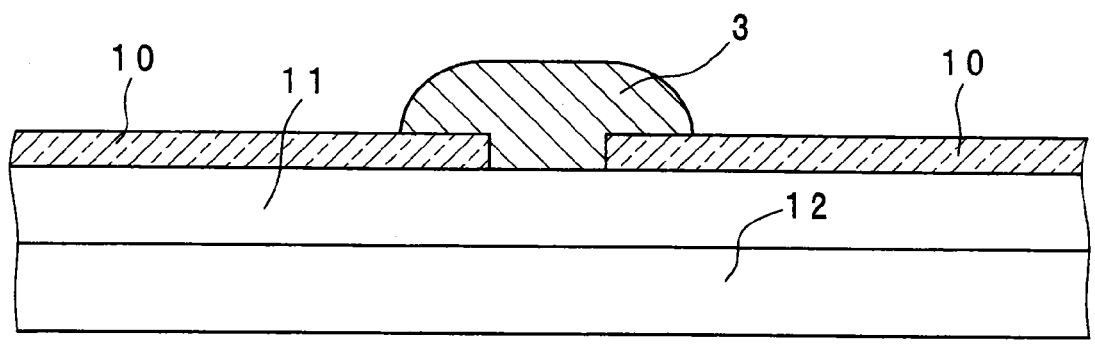
FIG. 18B is a cross-sectional view of the semiconductor device taken along line C-C' of FIG. 16.

FIG. 16 is a plan view of the semiconductor device in which a pair of pad electrodes 9's to be subjected to trimming process are represented; the state of the semiconductor device shown in FIG. 16 represents that before the subjection to the trimming process. FIG. 17A is a cross-sectional view of the semiconductor device taken along line B-B' of FIG. 16. FIG. 17B is a cross-sectional view of the semiconductor device taken along line C-C' of FIG. 16. FIG. 18A is a cross-sectional view of the semiconductor device taken along line B-B' of FIG. 16 and the state of the device represents that brought by subjecting the device shown in FIG. 16 to the trimming process. FIG. 18B is a cross-sectional view of the semiconductor device taken along line C-C' of FIG. 16 and the state of the device represents that brought by subjecting the device shown in FIG. 16 to the trimming process.

As shown in FIGS. 16, 17A and 17B, the semiconductor device according to the sixth embodiment has a structure in which as interlayer oxide film 11 is formed on a semiconductor substrate 12 and on the oxide film 11, the aluminum electrodes (pad electrodes) for trimming 9's are provided. Except the pairs of pad electrodes 9's to which wiring is carried out during the trimming process and the interlayer oxide film 11 exposed between the electrodes 9's, the surface of the semiconductor device according to the sixth embodiment is covered with a passivation film 10 and between the pairs of pad electrodes 9's, concave regions 13's are provided.

The semiconductor device having such a structure is subjected to trimming process by using the circuit drawing system of the semiconductor device manufacturing apparatus of any one of the first to third embodiments. As shown in FIGS. 18A and 18B, the conductive solvent is injected to the pairs of pad electrodes 9's and the concave portions 13's between them based on the trimming data to form the conductive wiring 3 between the pair of pad electrodes 9's, thereby the trimming process is finished.

When the trimming process is conducted in the manufacture of the semiconductor device, the pretreatment solution, the conductive solvent, and so on are injected from the print head onto the surfaces of the IC chips. Because of this, these solvents develop bleeding (drooling) during a time period over which the solvents volatilize and then solidify and disconnection may occur at the wiring portions on the surfaces of the IC chips. To prevent such a trouble, the semiconductor device according to the sixth embodiment is provided with a structure shown in FIG. 16; the passivation film 10 is patterned to form a concave region 13 while leaving a region to be subjected to trimming process as a region for the drawing pattern, thereby wiring drawing for the trimming process can be surely performed by injecting the necessary solution onto the concave region 13.

Figure 19:
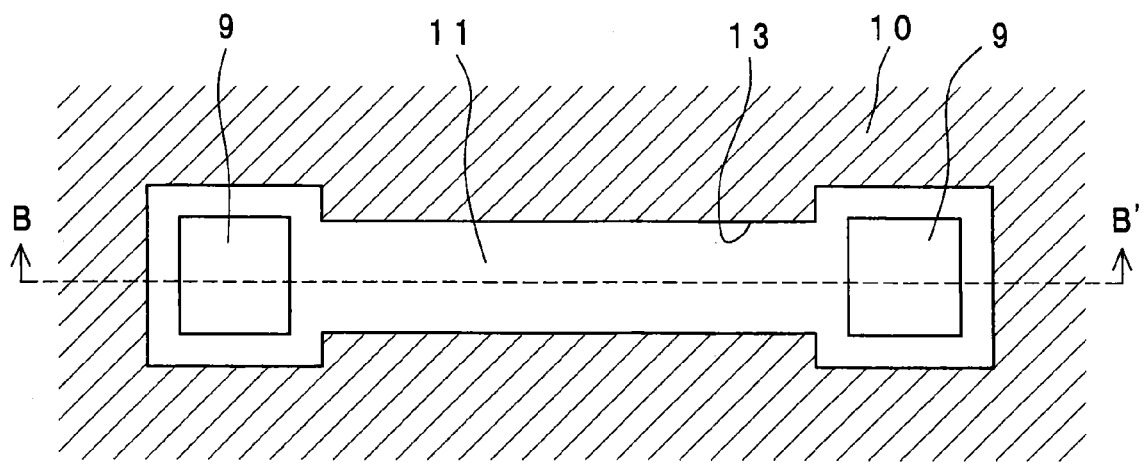
FIG. 19 is a plan view of another example of the semiconductor device manufactured by the semiconductor device manufacturing apparatus according to the sixth embodiment.
Figure 20A:
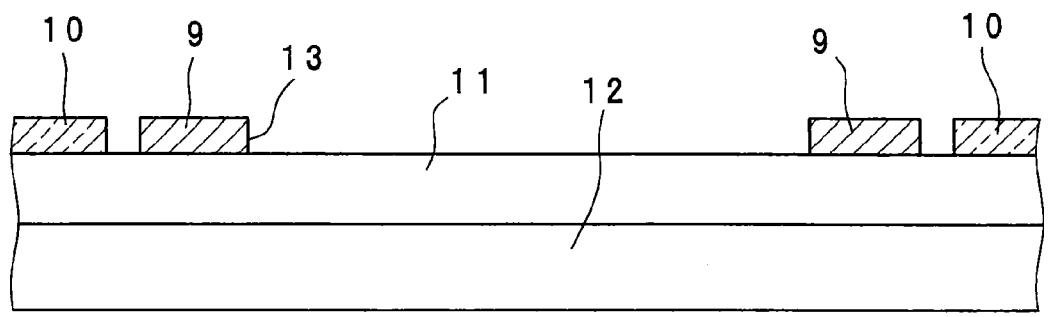
FIG. 20A is a cross-sectional view of the semiconductor device taken along line B-B' of FIG. 19.
Figure 20B:
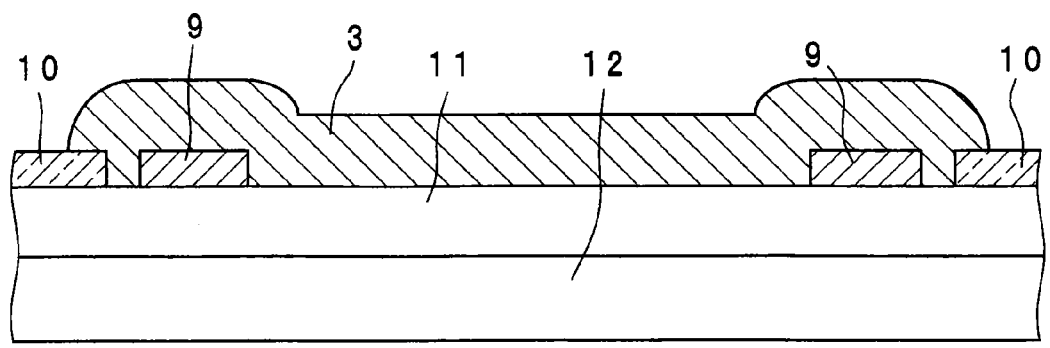
FIG. 20B is a cross-sectional view of the semiconductor device taken along line B-B' of FIG. 19, which is in a state effected after trimming process.

Also, as shown in FIG. 19, the concave region where the passivation film 10 is patterned may be extended to a region a predetermined distance from the aluminum electrodes (pad electrodes) for trimming 9's. FIG. 20A is a cross-sectional view of the semiconductor device taken along line B-B' of FIG. 19. FIG. 20B is a cross-sectional view of the semiconductor device taken along line B-B' of FIG. 19 having subjected to trimming process. As shown in FIG. 20B, since the concave region 13 to be subjected to trimming process is formed so as to surround the pad electrodes 9's, trimming process can be conducted with higher reliability.

Seventh Embodiment

A semiconductor device according to a seventh embodiment of the invention will be described below. The semiconductor device according to the seventh embodiment is a semiconductor device which is manufactured by using the semiconductor device manufacturing apparatus according to the first, second, or third embodiment and which is subjected to trimming process by using the drawing pattern printing part 110 of the circuit drawing system based on the trimming data obtained from the wafer test.

To improve accuracy in adjusting the characteristic values of the individual semiconductor devices through the trimming process, the types of the drawing patterns for the trimming process can be increased. However, when the plural drawing patterns are formed in such a way that the patterns are simply arranged, the solvents may develop bleeding (drooling) and flow into the adjacent drawing patterns to cause interference as described in the sixth embodiment. To cause defectives in the trimming process further is a thing which must be absolutely avoided. To prevent the occurrence of such defectives, there is a method of providing a sufficient spacing between the drawing patterns for trimming process and of widening margins in consideration of the drooling. However, such a method not only increases areas where the drawing patterns for the IC chips are provided but brings the loss of the IC chip areas attributed to the increased unavailable areas (an increased cost). To prevent this, as shown in FIG. 21, drooling prevention trenches 14's are further formed outside the concave regions (drawing pattern formation regions) 13's made of the passivation film 10 in such a manner as to surround the concave regions 13's.

Figure 21:
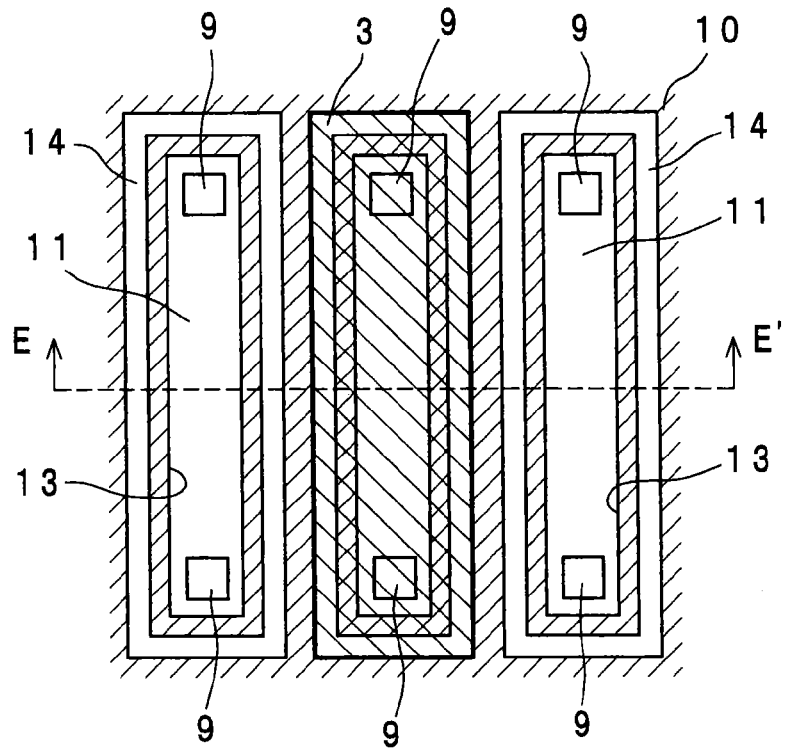
FIG. 21 is a plan view of a semiconductor device according to a seventh embodiment of the invention.
Figure 22A:
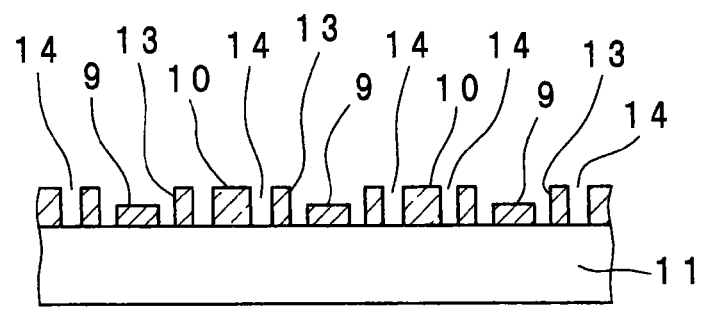
FIG. 22A is a cross-sectional view of the semiconductor device taken along line E-E' of FIG. 21.
Figure 22B:
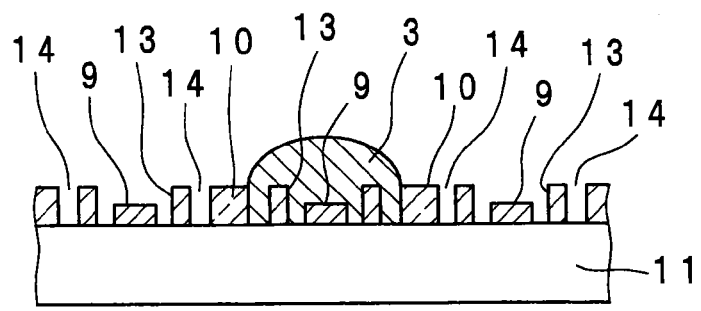
FIG. 22B is a cross-sectional view of the semiconductor device shown in FIG. 21 in which a solvent is applied to pad electrodes 9's to form a desired drawing pattern.

FIG. 21 is a plan view of the semiconductor device according to the seventh embodiment. FIG. 22A is a cross-sectional view of the semiconductor device taken along line E-E' of FIG. 21. FIG. 22B is a cross-sectional view of the semiconductor device taken along line E-E' of FIG. 21 and shows a state in which the solvents have been injected to the pad electrodes 9's to form a desired drawing pattern in the semiconductor device shown in FIG. 21.

As shown in FIGS. 22A and 22B, when the injected solvents have gone over the concave regions (drawing pattern formation regions) 13's, the solvents surely stop at the drooling prevention trenches 14's, thereby the interference with the adjacent drawing patterns is prevented.

In the semiconductor device shown in FIG. 21, an example has been made in which each drooling prevention trench 14 is formed so as to surround each concave region 13; while a structure is also effective in which such a drooling prevention trench 14 is plurally formed to surround each concave region 13. By forming the drooling prevention trenches as described above, the bleeding (drooling) of the solvents to regions requiring no solvent can be prevented, thereby the area of the drawing pattern for trimming process can be made as small as possible.

Eighth Embodiment

A semiconductor device according to an eighth embodiment of the invention will be described below. Like the semiconductor device according to the seventh embodiment, the semiconductor device according to the eighth embodiment is one which has been manufactured by using the semiconductor device manufacturing apparatus according to the first, second, or third embodiment and which has been subjected to trimming process based on the trimming data obtained from the wafer test by using the drawing pattern printing part 110 of the circuit drawing system.

Unlike the drooling prevention trenches of the semiconductor device according to the seventh embodiment, drooling prevention protrusions 15's are formed in the semiconductor device according to the eighth embodiment for the prevention of the drooling.

Figure 23:
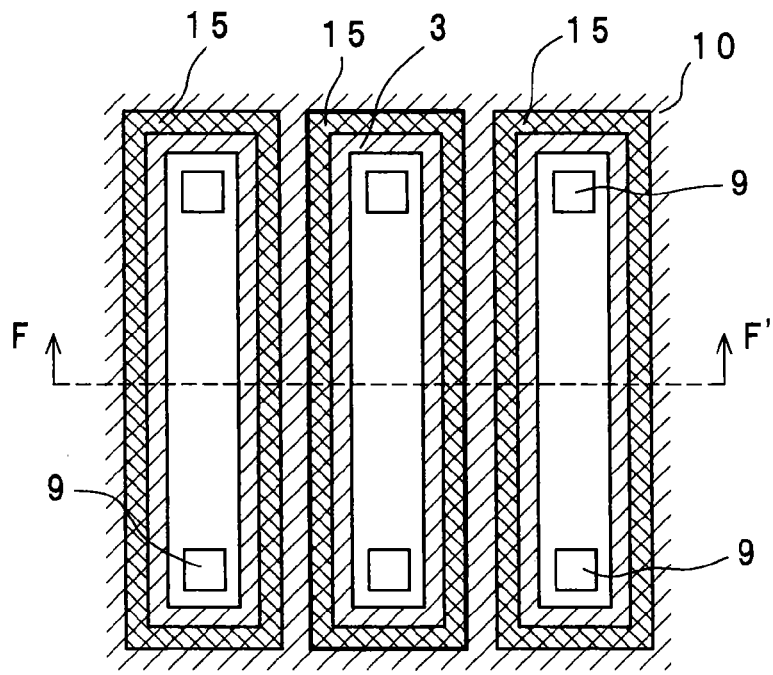
FIG. 23 is a plan view of a semiconductor device according to an eighth embodiment of the invention.
Figure 24A:
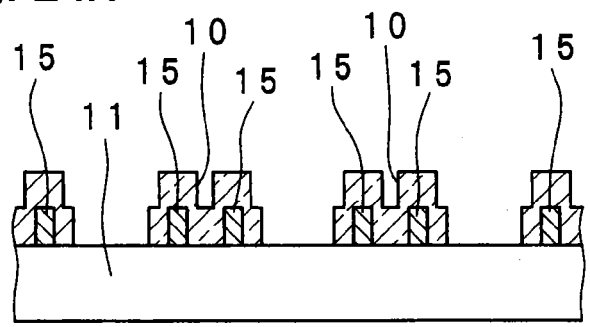
FIGS. 24A and 24B are cross-sectional views of the semiconductor device taken along line F-F' of FIG. 23.
Figure 24B:
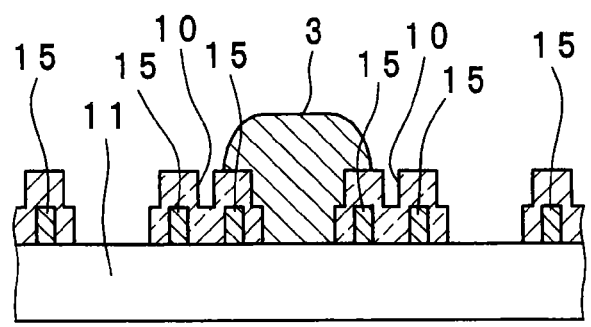

FIG. 23 is a plan view of the semiconductor device according to the eighth embodiment. FIG. 24A is a cross-sectional view of the semiconductor device taken along line F-F' of FIG. 23. FIG. 24B is a cross-sectional view of the semiconductor device taken along line F-F' of FIG. 23 and shows a state in which the solvents have been injected to the pad electrodes 9's to form a desired drawing pattern in the semiconductor device shown in FIG. 23.

As shown in FIG. 23, the drooling prevention protrusions 15's are formed so as to surround the concave regions (drawing pattern formation regions) 13's and are formed by providing pieces of aluminum wiring and by patterning a passivation film 10 on them. Therefore, in the semiconductor device according to the eighth embodiment, the passivation film 10 is formed around the concave regions 13's and further, the drooling prevention protrusions 15's, which are outer-ring protrusions surrounding the concave regions 13's, are formed so as to be covered with the passivation film 10. Because of this, as shown in FIGS. 24A and 24B, concave and convex portions are formed around the concave regions 13's, thereby the drooling from the concave regions 13's as the drawing pattern formation regions is completely prevented.

Ninth Embodiment

A semiconductor device according to the ninth embodiment of the invention will be described below. Like the semiconductor devices according to the seventh and eighth embodiments, the semiconductor device according to the ninth embodiment is one which is manufactured by using the semiconductor device manufacturing apparatus according to the first, second, or third embodiment; however, the semiconductor device according to the ninth embodiment has a structure in which the drooling is prevented by wiring drawing operation different from those of the semiconductor devices according to the seventh and eighth embodiments.

Figure 25:
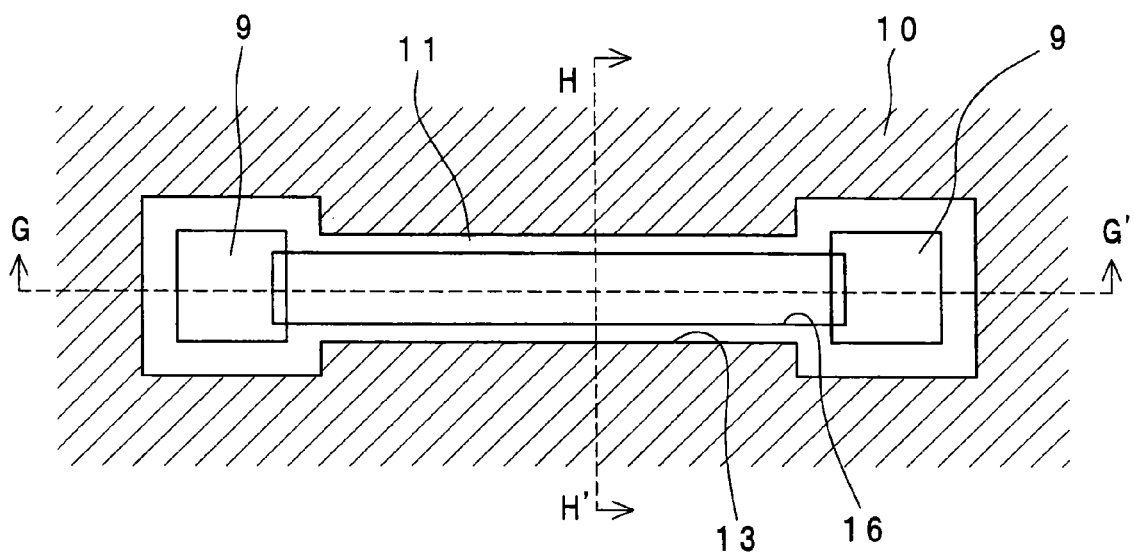
FIG. 25 is a plan view of a semiconductor device according to a ninth embodiment of the invention.
Figure 26A:
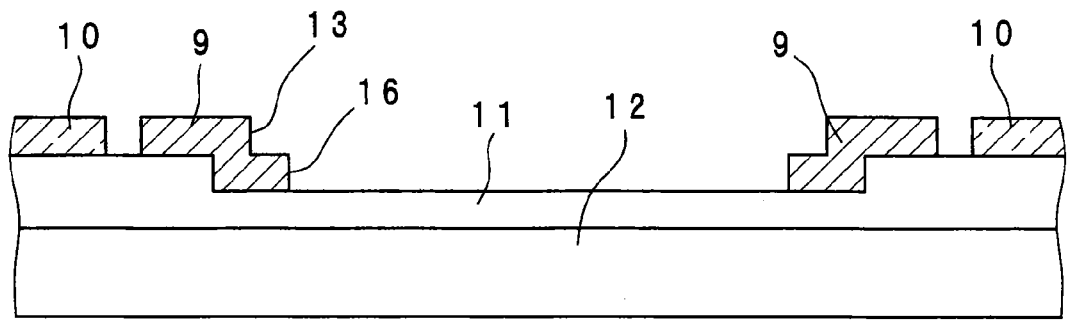
FIGS. 26A and 26B show states of the semiconductor device according to the ninth embodiment represented before the drawing pattern of the semiconductor device is subjected to trimming process.
Figure 26B:
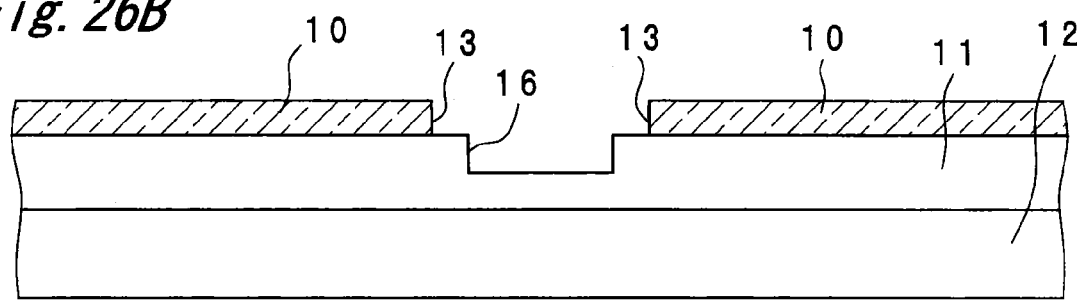
Figure 27A:
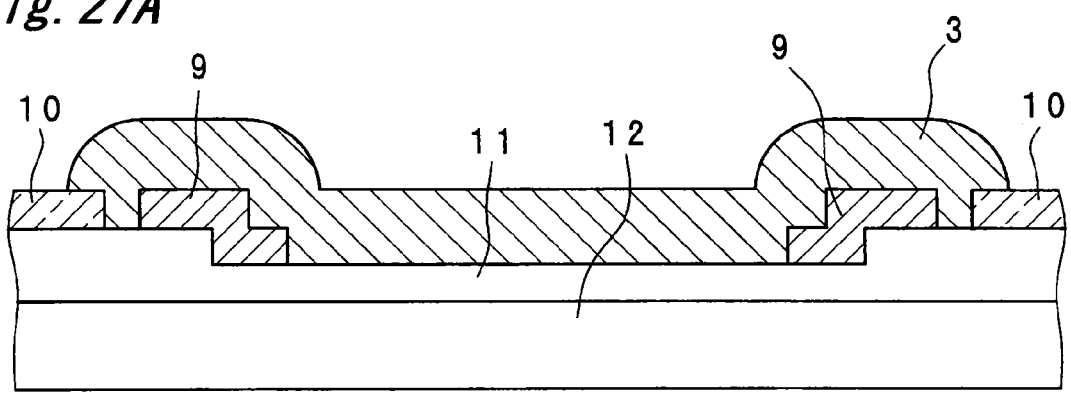
FIGS. 27A and 27B show states of the semiconductor device according to the ninth embodiment effected after the trimming process.
Figure 27B:
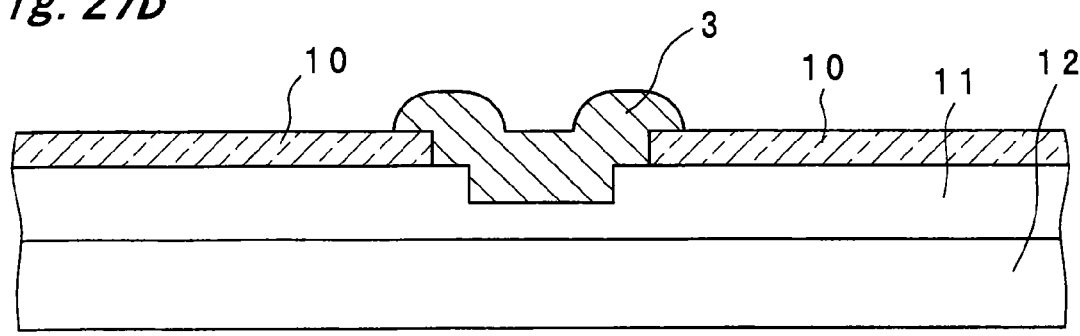

FIG. 25 is a plan view of the semiconductor device according to the ninth embodiment. FIGS. 26A and 26B are cross-sectional views of the semiconductor device according to the ninth embodiment and in this figure, the state of the semiconductor device before its drawing pattern is subjected to trimming process is shown. And further, FIGS. 27A and 27B are cross-sectional views of the semiconductor device which is in a state after the trimming process. FIG. 26A is a cross-sectional view of the semiconductor device taken along line G-G' of FIG. 25, and FIG. 26B is a cross-sectional view of the semiconductor device taken along line H-H' of FIG. 25. FIG. 27A is a cross-sectional view of the semiconductor device taken along line G-G' of FIG. 25 which is in a state after the trimming process. FIG. 27B is a cross-sectional view of the semiconductor device taken along line H-H' of FIG. 25 which is in a state after the trimming process.

As shown in FIGS. 25, 26A, 26B, 27A and 27B, a groove 16 is formed in the interlayer insulating film 11 under the concave region 13 formed by the passivation film 10. The groove 16 is formed by denting the interlayer insulating film 11 in such a way that spots, in which the pair of pad electrodes 9's to be connected with each other in the trimming process are formed, are connected with other. The groove 16 is formed by denting the interlayer insulating film 11 in the contact etching process and so on of the semiconductor device manufacturing process and stages are formed to the pad electrodes 9's in consideration of subsequent steps by forming concave and convex portions at the surface of the interlayer insulating film 11 to a large extent. By forming such a structure, the drooling of the injected conductive solvent 114 is prevented in the trimming process and the desired conductive wiring 3 can be formed in the predetermined regions.

Tenth Embodiment

A semiconductor device according to a tenth embodiment of the invention will be described below. The semiconductor device according to the tenth embodiment is a semiconductor device which is manufactured by using the semiconductor device manufacturing apparatus according to the first, second, or third embodiment and which is subjected to trimming process based on the trimming data corresponding to the results of the wafer test by using the drawing pattern printing part 110 of the circuit drawing system. The semiconductor device according to the tenth embodiment is an IGBT (insulated gate bipolar transistor).

Figure 28:
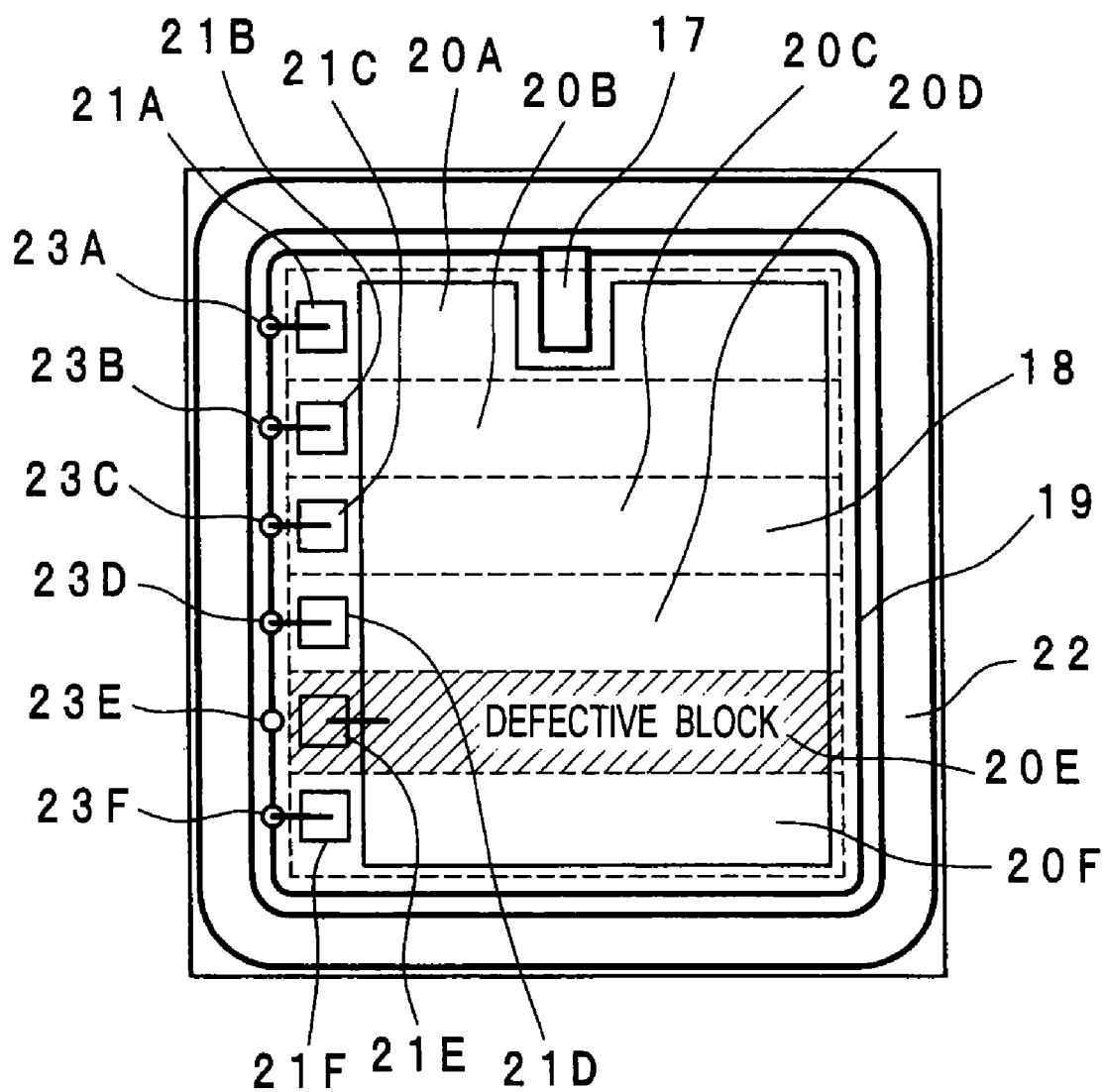
FIG. 28 is a plan view of an IGBT chip as a semiconductor device according to a tenth embodiment of the invention.
Figure 29:
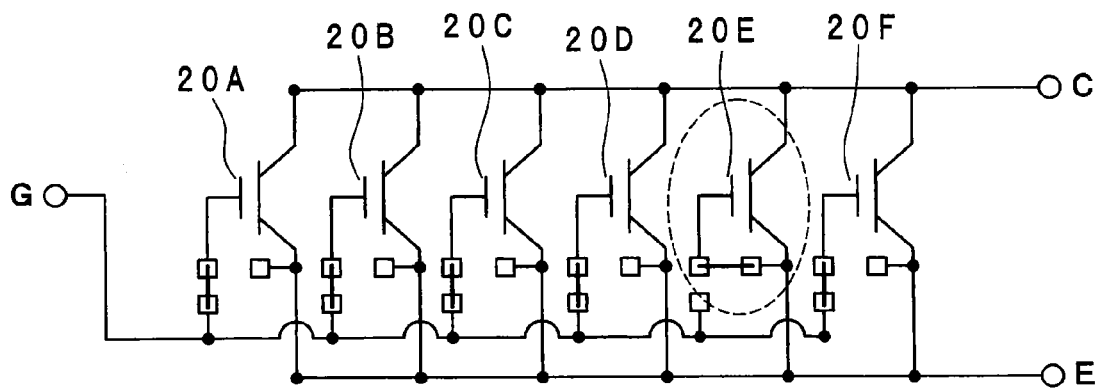
FIG. 29 is a circuit diagram for showing an equivalent circuit of the IGBT chip shown in FIG. 28.

FIG. 28 is a plan view of the IGBT chip as the semiconductor device according to the tenth embodiment. As shown in FIG. 28, the IGBT chip has a gate electrode pad 17, an emitter electrode pad 18, and aluminum wiring for routing the gate electrode 19. In the IGBT chip, reference numeral 22 denotes a high-withstand voltage isolation region. FIG. 29 is a circuit diagram showing an equivalent circuit of the IGBT chip shown in FIG. 28. From a microscopic point of view, the IGBT chip as the semiconductor device according to the tenth embodiment is bulk materials of a plurality of minute IGBT cells as shown at the equivalent circuit of FIG. 29. The IGBT chip according to the tenth embodiment includes the six IGBT cells 20A, 20B, 20C, 20D, 20E, and 20F.

In general, IGBTs having large chip areas have a structure in which a product defect attributed to a short between a gate and an emitter caused by the defect of a gate oxide film tends to occur. Such a gate failure occurs at only a few of the IGBT cells of the IGBT chips and when the gate failure has been occurred even at one spot, the entire IGBT chips are judged as being defectives and are thrown away. Therefore, by cutting gate wiring only at the IGBT cells where the gate failure occurs and causing a short between their gates and emitters, that is, by subjecting the IGBT cells concerned to trimming process, it becomes possible to make the entire IGBT chips nondefective.

Therefore, in the IGBT chip as the semiconductor device according to the tenth embodiment, the IGBT cells 20A, 20B, 20C, 20D, 20E, and 20F are provided with trimming pad electrodes 21A, 21B, 21C, 21D, 21E, and 21F respectively so as to make it possible to conduct the trimming process after the completion of the check of the IGBT cells conducted during the wafer test. In the check of the IGBT cells, whether the gate is faulty is checked by making a measuring probe contact the pad electrodes 21A, 21B, 21C, 21D, 21E, and 21F of the individual IGBT cells.

In the IGBT chip shown in FIG. 28, a state is shown in which it has been detected during the check that a gate failure occurs only at the IGBT cell 20E and trimming process has been conducted. Moreover, FIG. 29 is the circuit diagram showing the equivalent circuit of the IGBT chip showing in FIG. 28, in which a short is caused between the gate and the emitter of the IGBT cell 20E. In the non-defective IGBT cells of the IGBT chip, the pad electrodes 21A, 21B, 21C, 21D, and 21F are connected to the gate electrode via the aluminum wiring for routing the gate electrode 19 and the gate pad electrode 17. Trimming pads 23A, 23B, 23C, 23D, 23E, and 23F are formed at the spots of the aluminum wiring 19 which correspond to the pad electrodes 21A, 21B, 21C, 21D, 21E, and 21F. Therefore, at the trimming process, the pad electrodes 21A, 21B, 21C, 21D, and 21F are connected to the corresponding trimming pads 23A, 23B, 23C, 23D, and 23F of the aluminum wiring 19. On the other hand, the defective IGBT cell 20E where the gate failure has been detected is subjected to the trimming process in which the pad electrode 21E is connected to the emitter electrode pad 18. All the IGBT cells have the same emitter electrode pad 18.

By conducting the trimming process as described above, only the defective IGBT cell becomes nonusable and the entire IGBT chips becomes nondefective.

Figure 30:
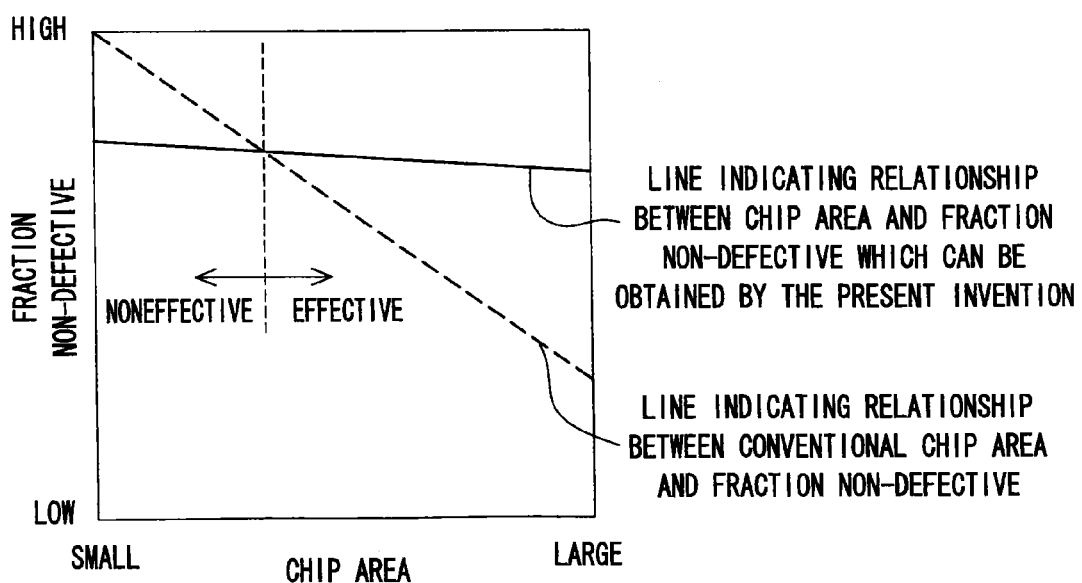
FIG. 30 is a graph for showing an effect of the IGBT as the semiconductor device according to the tenth embodiment.

FIG. 30 is a graph for showing an effect on the IGBT as the semiconductor device according to the tenth embodiment of the invention. In the graph of FIG. 30, a broken line represents a relationship between the chip area and the fraction non-defective of a conventional semiconductor device and a solid line represents a relationship between the chip area and the fraction non-defective of the IGBT as the semiconductor device according to the tenth embodiment.

As described above, the fraction non-defective of the IGBT decreases as the chip area increases. The IGBT according to the tenth embodiment has an unavailable region in the chip surface because there is a need to form the pad electrodes and the trimming pads. Therefore an apparent fraction non-defective essentially decreases. This is because when the number of chips which can be manufactured in one wafer, for example, 500 pieces, decreases to 450 pieces due to increased unavailable areas, the apparent fraction non-defective of the chips becomes 90%.

However, in the semiconductor device according to the tenth embodiment of the invention, since even the defective IGBT chip can be corrected as a non-defective, the decrease in the fraction non-defective to the chip area is greatly improved. However, when the IGBT cell has become defective due to causes other than the gate failure and when the plural IGBT cells have become defective at one IGBT chip, such IGBTs are sometimes not corrected. Because of this, as indicated with the solid line of FIG. 30, in the semiconductor device according to the tenth embodiment of the invention as well, all the defective IGBTs are not necessarily corrected and the line somewhat declines. However, when the chip area is large to a certain extent as compared with that of the conventional semiconductor device indicated with the broken line, a noticeable effect is shown.

As shown in FIG. 30, when the chip area is small, the conventional semiconductor device is higher than that according to the tenth embodiment in the fraction non-defective. This is because an appearance fraction non-defective is included as described above and hence, they are almost the same in actual fractions non-effective. However, when the chip area of the semiconductor device according to the tenth embodiment of the invention is increased to a certain extent, its effect noticeably increases.

Eleventh Embodiment

A semiconductor device according to the eleventh embodiment of the invention will be described below. The semiconductor device according to the eleventh embodiment is a semiconductor device which is manufactured by using the semiconductor device manufacturing apparatus according to the first, second, or third embodiment and which is provided with electrostatic shielding formed with the printing operation of the drawing pattern printing part 110 of the circuit drawing system. The semiconductor device according to the eleventh embodiment is an EPROM (erasable programmable read only memory) of nonvolatile memory.

Figure 31:
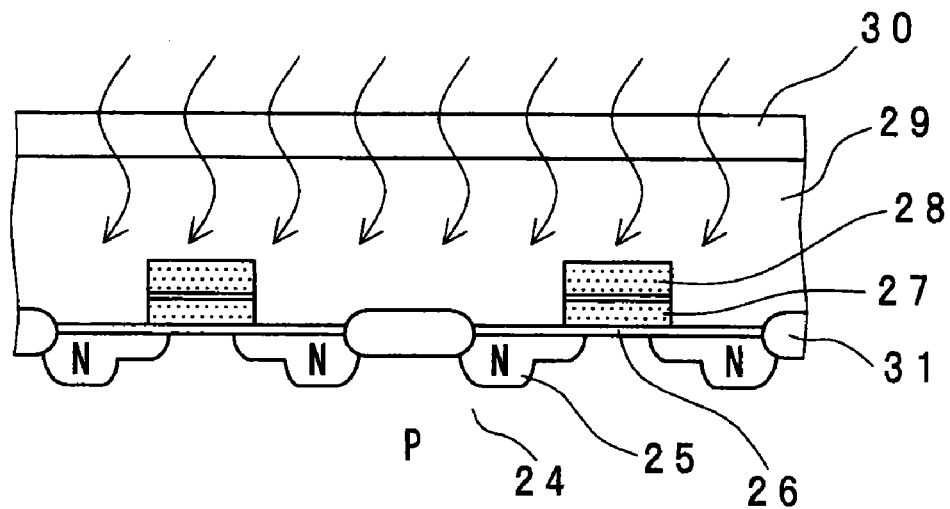
FIG. 31 is a cross-sectional view of a typical EPROM (Erasable Programmable Read Only Memory) of nonvolatile memory.

FIG. 31 is a cross-sectional view of a typical EPROM of nonvolatile memory. In FIG. 31, the N-channel EPROM has a p-type semiconductor substrate 24, n-type diffused regions 25's which are the source/drain of the EPROM, gate oxide film 26, a floating gate 27, a control gate 28, an interlayer oxide film 29, a passivation film 30, and field oxide film 31. In this EPROM, the floating gate 27 and the control gate 28 have a self-aligned structure.

The typical EPROM performs write- and erase-operations during a wafer test for the check of its operation. To erase data at the wafer test, there is a need to excite electrons within the floating gate 27 by applying light such as ultraviolet light. Therefore, in the conventional EPROM, it is required that the interlayer oxide film 29 and the passivation film 30 have high light transmittance. A silicon oxide film ($SiO_2$) used as the interlayer oxide film 29 has no problem because it has a high light transmittance inherently. In addition, a silicon nitride (SiN) film used as the passivation film 30 acting as a protective film has become a film body with by being formed under a special condition. Since the silicon nitride film has included many N—H bonds at this time, its refractive index has had to be set at 1.95 or lower.

Figure 32:
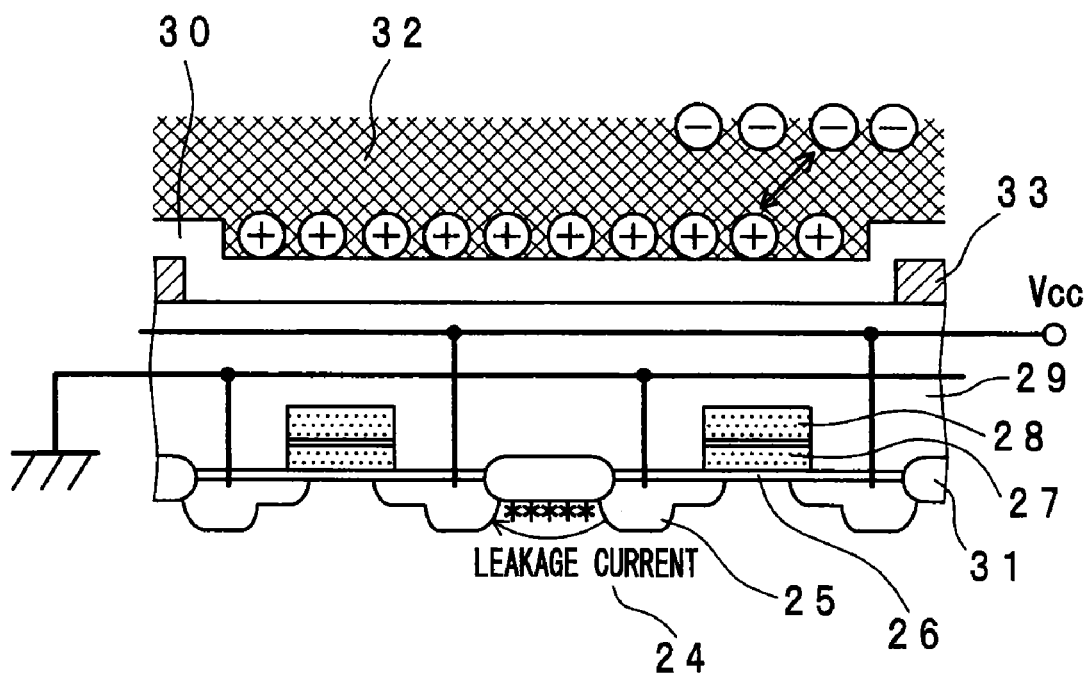
FIG. 32 is a cross-sectional view of the EPROM which is formed on the same chip with a high-withstand voltage element and then packaged with a molding resin.

When the conventional EPROM having such a structure and a high-withstand voltage element have been formed on the same chip together, a problem described below arises. FIG. 32 is a cross-sectional view of the conventional EPROM which has been formed on the same chip with a high-withstand voltage element and then packaged with a molding resin 32.

When the conventional EPROM having a structure shown in FIG. 32 has been formed on the same chip with the high-withstand voltage element, an electric flux line from the high-withstand voltage element reaches the EPROM of a low-potential region, so that polarization occurs at the molding resin 32 as the packaging material of the EPROM. Due to the polarization, a positive charge is excited on the EPROM side of the molding resin 32. As a result, a state is brought about in which the molding resin 32 provides a positive potential as the gate. At this time, the polarity of the p-type semiconductor substrate 24 under the field oxide film 31 between the source and the drain of the EPROM is reversed due to the effect of the positive charge of the molding resin 32 to form a n-type MOS channel. Consequently, as shown in FIG. 32, the problem arises that a leakage current occurs between the source and the drain to effect corruption of data.

In conventional EPROMs having such a structure, as a measure against the trouble resulting from the polarization at the molding resin (mold polarization), a semi-insulating silicon nitride film 33 is sometimes used as part of the passivation film 30. However, when such a semi-insulating silicon nitride film 33 has been used, the silicon nitride film 33 has been formed by patterning so as not to be formed on the EPROM in such a way that light reaches the EPROM because the silicon nitride film 33 has a refractive index of 2.1 or higher and, therefore, has a very poor light transmittance.

Therefore, in the EPROM as the semiconductor device according to the eleventh embodiment of the invention, the electrostatic shield is formed though the printing operation of the semiconductor device manufacturing apparatus described in the first, second, or third embodiment after the wafer test.

Figure 33:
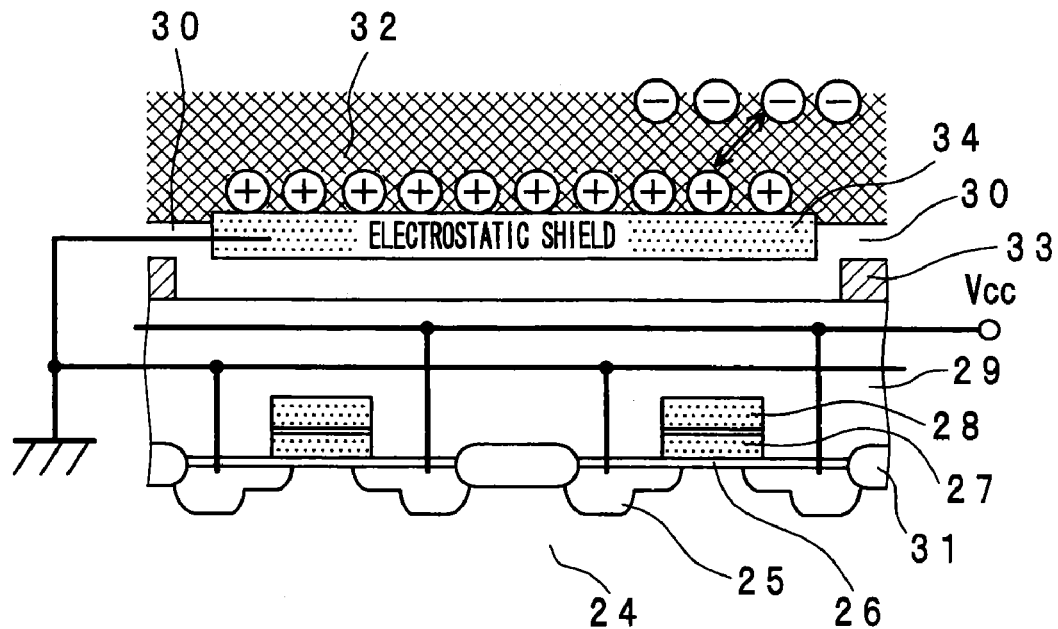
FIG. 33 is a cross-sectional view of a structure of an EPROM according to an eleventh embodiment of the invention.

FIG. 33 is a cross-sectional view of a structure of the EPROM according to the eleventh embodiment of the invention. As shown in FIG. 33, since there is no need to erase the data through the application of light after the wafer test, the electrostatic shield 34 is printed in a region on the EPROM uncovered with the semi-insulating silicon nitride film 33 through the use of the wiring drawing technique of the invention. The electrostatic shield 33 is conductive wiring formed by injecting a conductive solvent. The electrostatic shield 34 functions as a shielding film which prevents the mold polarization effected when the EPROM has been packaged with the molding resin by being connected to a GND terminal and so on.

In the semiconductor device according to the eleventh embodiment having such a structure, the high-withstand voltage element and the EPROM can be formed on the same chip together because the trouble that the mold polarization occurs can be prevented.

Twelfth Embodiment

A semiconductor device according to the twelfth embodiment of the invention is a high voltage integrated circuit device (HVIC) which is formed by integrating a power semiconductor device and a logic circuit onto one chip. In the manufacture of the high voltage integrated circuit device (hereinafter referred to as HVIC), level-shift wiring described below is formed by using the print head of the semiconductor device manufacturing apparatus described in the first, second, or third embodiment.

Figure 34:
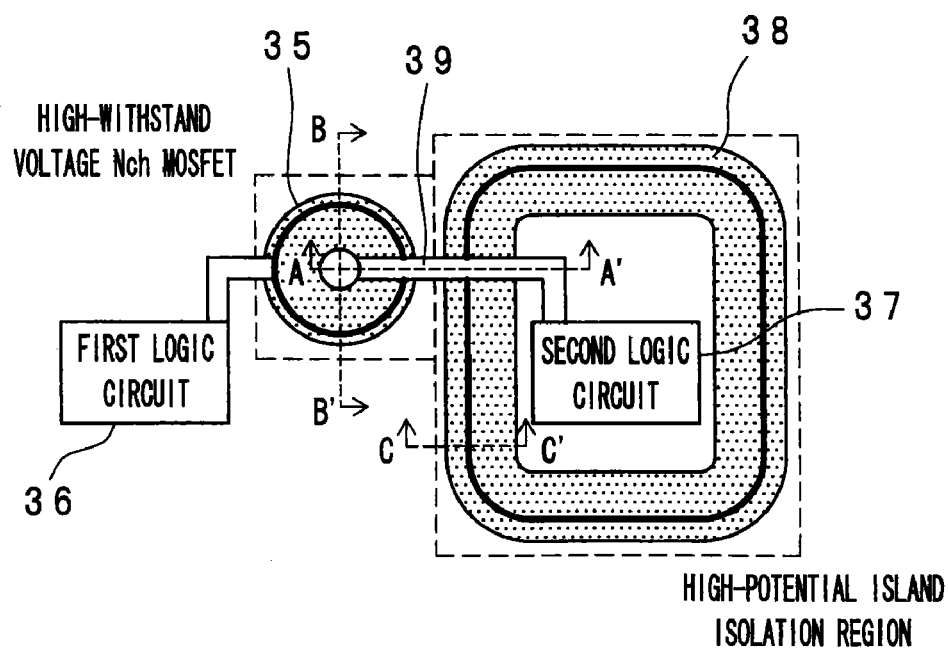
FIG. 34 is a plan view of a conventional high voltage integrated circuit device.
Figure 35:
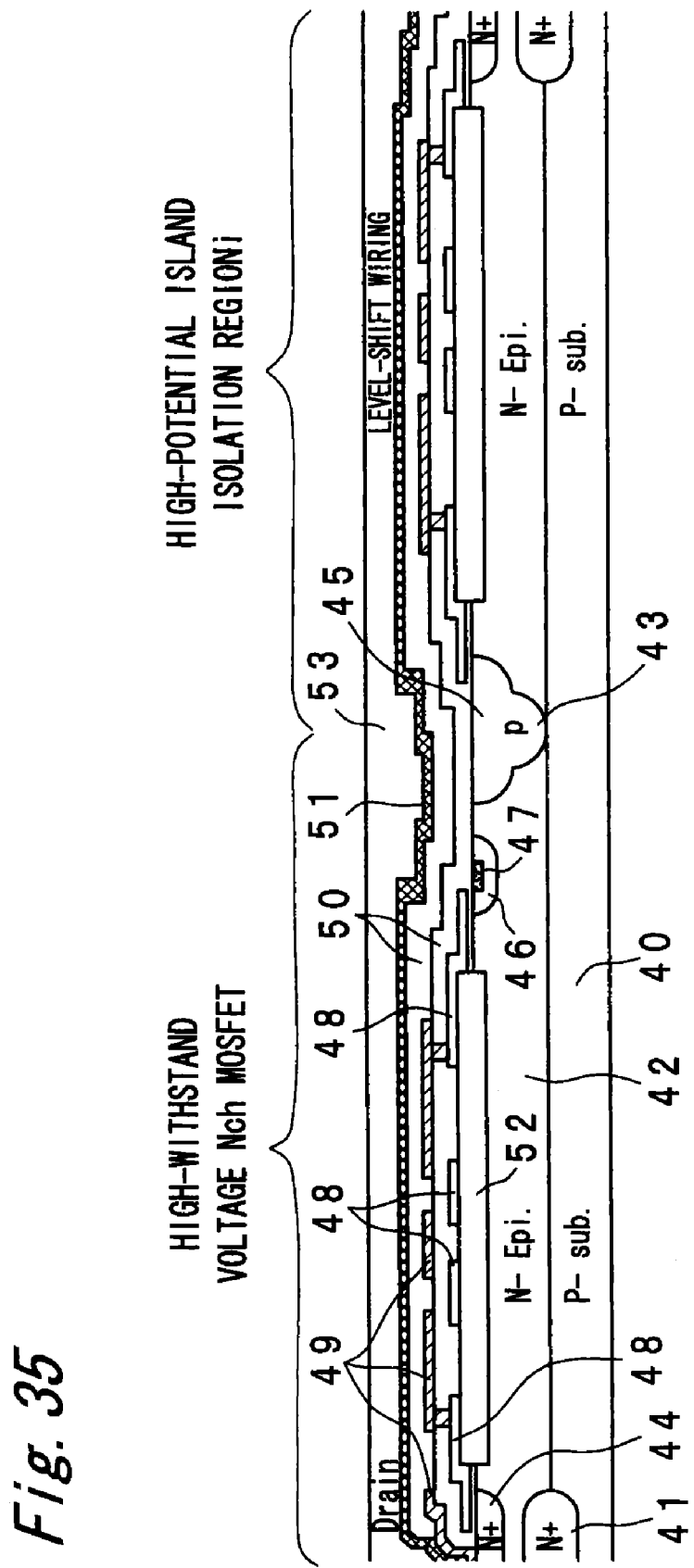
FIG. 35 is a cross-sectional view of the conventional high voltage integrated circuit device taken along line A-A' of FIG. 34.
Figure 36:
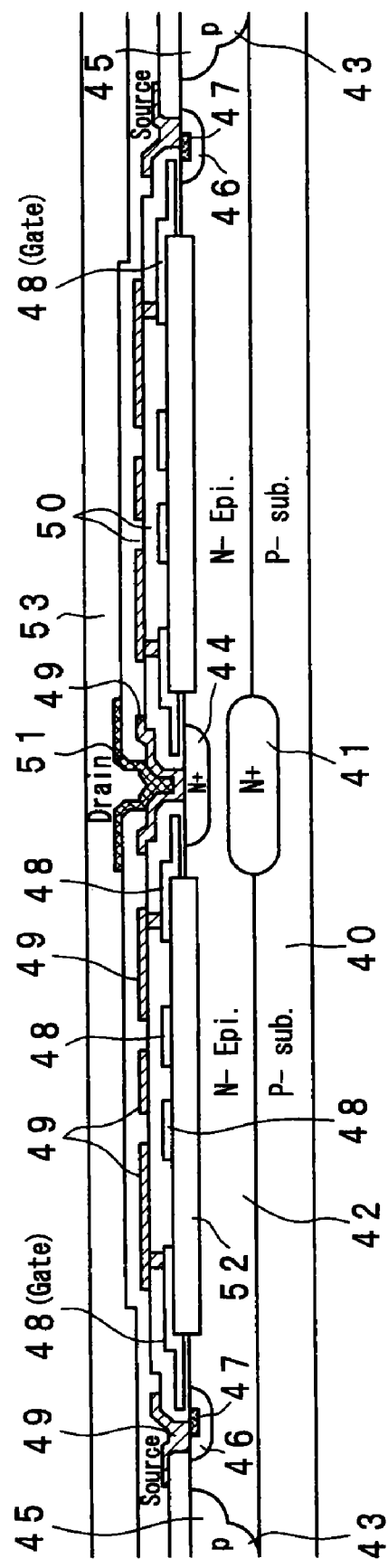
FIG. 36 is a cross-sectional view of the conventional high voltage integrated circuit device taken along line B-B' of FIG. 34.
Figure 37:
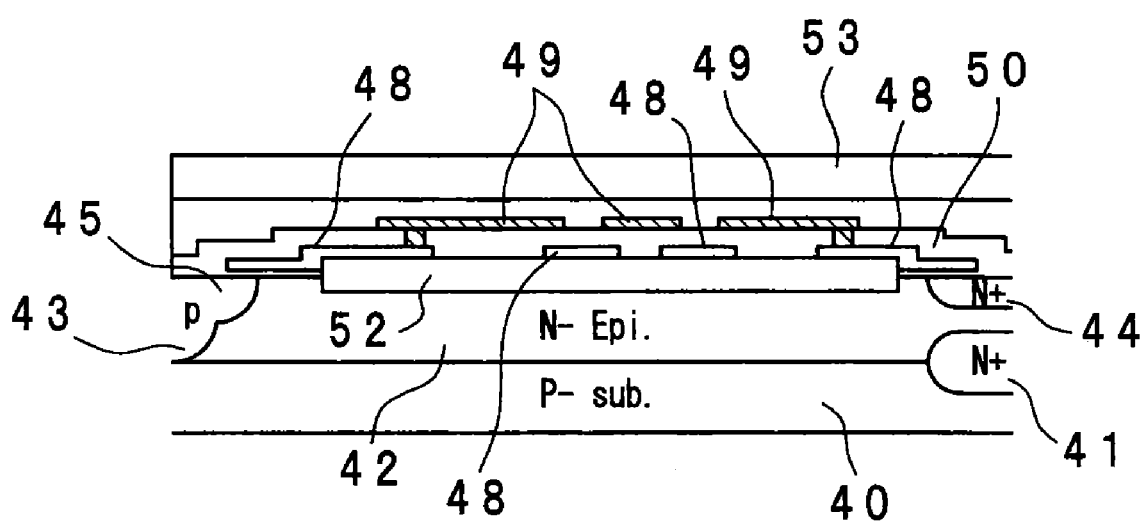
FIG. 37 is a cross-sectional view of the conventional high voltage integrated circuit device taken along line C-C' of FIG. 34.

FIG. 34 is a plan view of a conventional high voltage integrated circuit device (HVIC) formed by integrating a power semiconductor device and a logic circuit onto one chip. This high voltage integrated circuit device (hereinafter abbreviated as HVIC) is used for the drive control of various equipment such as motors, lighting fixtures, and visual equipment. FIGS. 35 to 37 are cross-sectional views of the HVIC shown in FIG. 34. FIG. 35 is a cross-sectional view of the HVIC taken along line A-A' of FIG. 34. FIG. 36 is a cross-sectional view of the HVIC taken along line B-B' of FIG. 34. FIG. 37 is a cross-sectional view of the HVIC taken along line C-C' of FIG. 34.

The HVIC shown in FIG. 34 has a high-withstand voltage N-channel MOSFET 35, a first logic circuit 36 connected to the gate electrode of the MOSFET 35, and a high-potential island isolation region 38 having a second logic circuit 37 on a high potential side connected to the drain electrode of the MOSFET 35. The drain electrode of the MOSFET 35 and the second logic circuit 37 are connected with each other via high-potential level-shift wiring 39.

As shown in the cross-sectional views of the HVIC of FIGS. 35, 36, and 37, a $N^+$-type buried diffused region 41 and a $N^-$-type epitaxial layer 42 are formed on a P-type semiconductor substrate 40. As shown in FIG. 35, a $P^+$-type isolated diffused region 43 is formed so as to reach the buried diffused region 41. In FIGS. 35, 36, and 37, reference numeral 44 is a deep $N^+$-type diffused region, reference numeral 45 is a P-type diffused region, reference numeral 46 is a $P^+$-type diffused region, reference numeral 47 is a $N^+$-type diffused region, reference numeral 48 is a gate electrode which is also used as a field plate, reference numeral 49 is an aluminum electrode which is also used as a GND-side field plate, reference numeral 50's are oxide films, reference numeral 51 is a level shift aluminum electrode which is used as level-shift wiring, and reference numeral 52 is a field oxide film (LOCOS film). In addition, reference numeral 53 is a passivation film serving as a protective film.

The HVIC with such a structure has an isolation structure in the form of a RESURF (reduced surface field) structure in which the $N^+$-type buried diffused region 41 and the $N^-$-type epitaxial layer 42 are isolated and surrounded by the $P^+$-type isolated diffused region 43.

In the conventional HVIC, there is the problem that since the high-potential level shift aluminum electrode 51 crosses over the $P^+$-type isolated diffused region 43 and the P-type diffused region 45 having a substrate potential, the expansion of a depletion layer is inhibited and a withstand voltage is decreased. To solve such a problem, the conventional structure shown in FIG. 35 has taken the form of a MFFP (multiple floating field plate) structure in which the field plates are formed on the PN junction by using the gate electrode 48 and so on to secure the expansion of the depletion layer and then the field plates are formed one over another through floating so as to stabilize a surface electric field through capacity coupling.

However, in such a conventional structure, the thickness of the oxide film 50, which is formed between the level shift aluminum electrode 51 serving as the high-potential level-shift wiring and the aluminum electrode 49 as the GND-side field plate, has been set at 1.0 μm or thicker. However, such a structure has caused the problem that the manufacturing process of the HVIC increases in complexity and its production cost rises. In addition, there has been the demerit that when the interlayer oxide film 50 is thick, fine patterning techniques are not applicable.

In the high voltage integrated circuit device (HVIC) as the semiconductor device according to the twelfth embodiment of the invention, the level-shift wiring is drawn by using the semiconductor device manufacturing apparatus described in the first, second, or third embodiment and the problems described above are solved.

Figure 38:
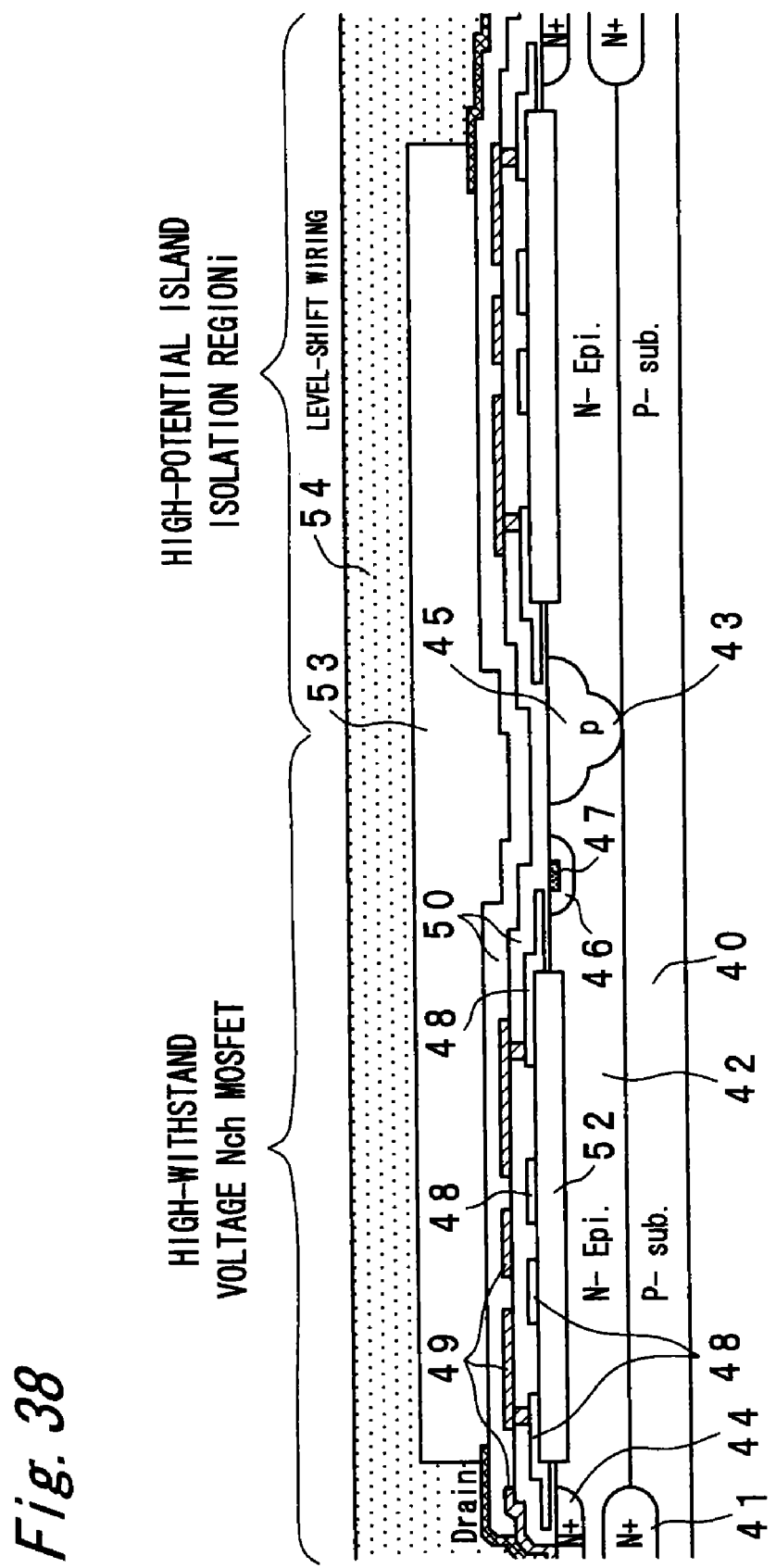
FIG. 38 is a cross-sectional view of a structure of an HVIC as a semiconductor device according to a twelfth embodiment of the invention.

FIG. 38 is a cross-sectional view of a structure in which the level-shift wiring 54 is formed in the HVIC according to the twelfth embodiment of the invention. In FIG. 38, film bodies having the same functions as those shown in FIGS. 35 to 37 are given the same reference numerals.

In the HVIC according to the twelfth embodiment shown in FIG. 38, the level-shift wiring 54 as conductive wiring is formed on the passivation film 53 by using the circuit drawing system of the semiconductor device manufacturing apparatus described in the first, second, or third embodiment. As a result, there is no need to not only provide the level shift aluminum electrode 51 shown in FIG. 35 but set the thickness of the interlayer oxide film 50 on the top surface side of the aluminum electrode 49 as the GND-side field plate at 1.0 μm or thicker. Consequently, fine patterning techniques are applicable to the manufacture of the HVIC.

Moreover, in the HVIC according to the twelfth embodiment, since patterning for the formation of the passivation film 53 is required only to have openings of tens of micrometers or more for pad electrodes, the passivation film 53 can be formed so as to have a thickness above 1.0 micrometer. And furthermore, since a semi-insulating SiN film is applicable to the passivation film 53, it is also possible to further reduce the effect on the electric field distribution at the Si surface through the electrostatic shielding effect.

Incidentally, in the semiconductor device according to the invention, a total area of the spots where the wiring is formed is sometimes larger than that of the insulated region depending on the IC chip surfaces. In those cases, printing is conducted at the IC chip surface by injecting a substance with high insulation properties such as polyimide to the spots where no wiring is formed as a printing solvent. Thereafter, by applying a conductive solvent to the entire wafer surface, the insulative film is surely formed at the insulated region of the IC chip surface, so that the insulated region of the IC chip surface is surely insulated and the reliable semiconductor device is produced.

Figure 39:
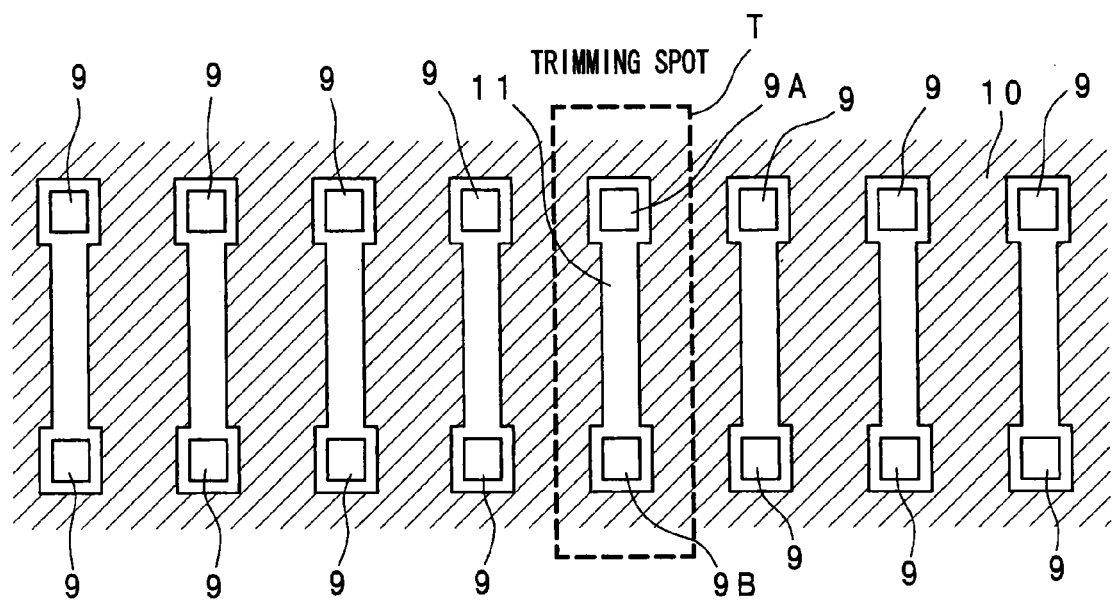
FIG. 39 is a plan view for showing an example in which a plurality of pad electrodes for trimming are formed in the semiconductor device according to the invention.

FIG. 39 is a plan view for showing an example of the formation a plurality of pad electrodes for trimming in the semiconductor device according to the invention. In the semiconductor device shown in FIG. 39, cutting between the pad electrodes specified so as to be subjected to trimming process and connection between the other pad electrodes are performed. In the trimming process for the semiconductor device shown in FIG. 39, the film body is formed by using the circuit drawing system so as to bring about states in which the pad electrodes 9A and 9B within a region surrounded by a broken line T are not connected with each other and the other pad electrodes 9's are connected with each other.

Figure 40:
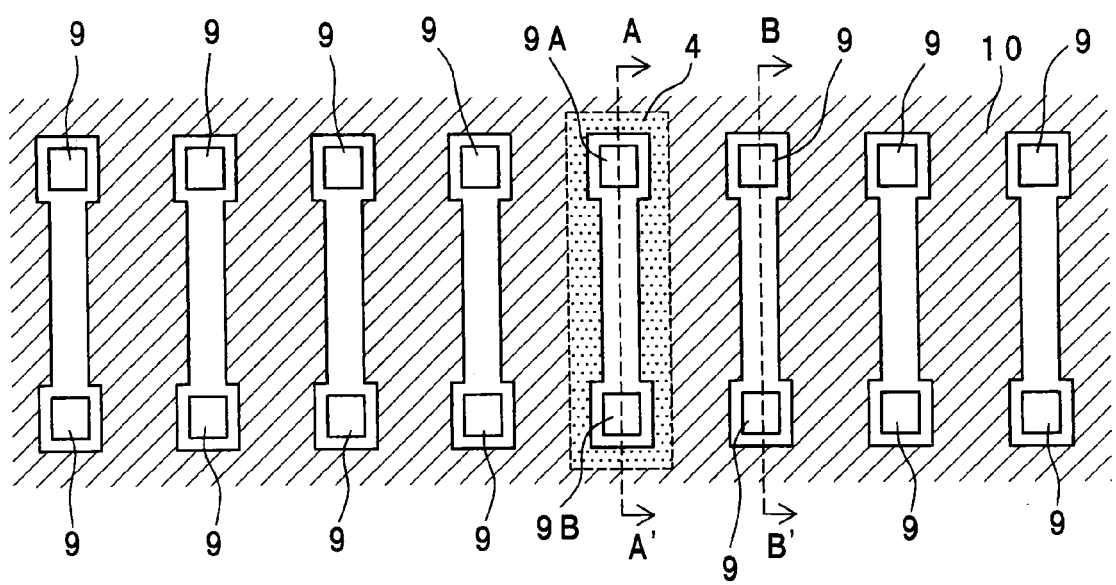
FIG. 40 is a plan view for showing a state in which an insulative solvent is injected between the two pads electrodes 9A and 9B of the semiconductor device shown in FIG. 39 and an insulative film body 4 is formed.
Figure 41:
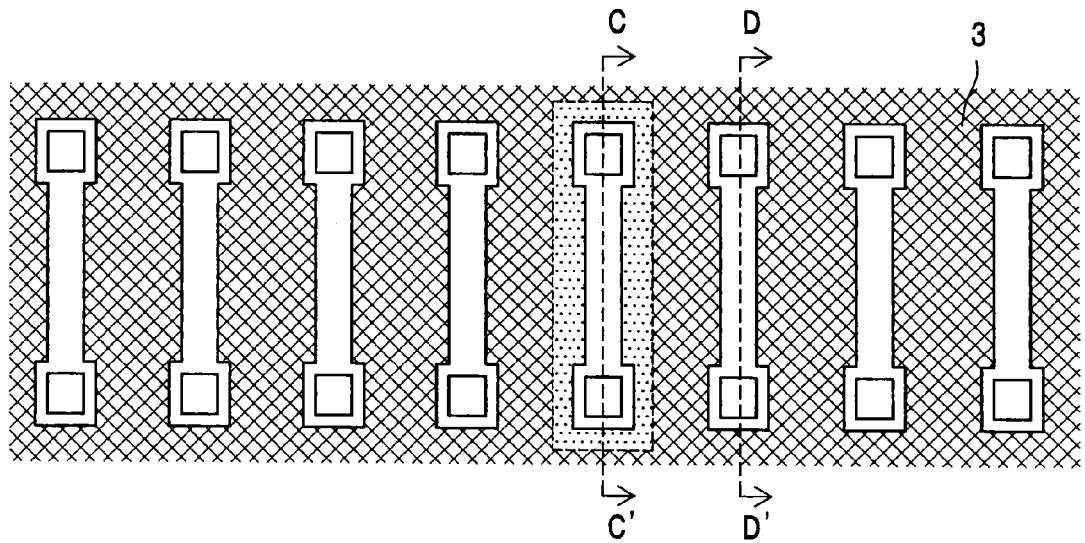
FIG. 41 is a plan view for showing a state in which a conductive solvent is applied to an entire surface which becomes a drawn pattern formation region of the semiconductor device shown in FIG. 40 and a conductive film body 3 is formed.

FIG. 40 is a plan view for showing a state in which the insulative solvent has been injected between the two pad electrodes 9A and 9B of the semiconductor device shown in FIG. 39 to form the insulative film body 4. FIG. 41 is a plan view for showing a state in which the conductive solvent has been applied to an entire surface which becomes the drawn pattern formation region of the semiconductor device shown in FIG. 40 to form the conductive film body 3.

Figure 42A:
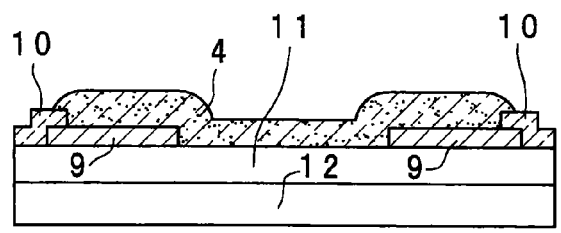
FIG. 42A is a cross-sectional view of the semiconductor device taken along line A-A' of FIG. 40.
Figure 42C:
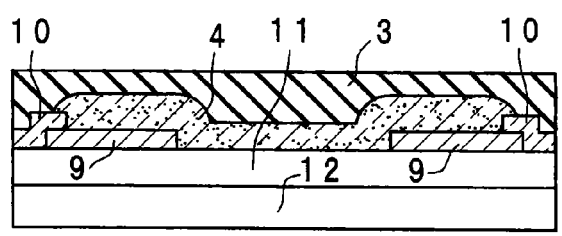
FIG. 42C is a cross-sectional view of the semiconductor device taken along line C-C' of FIG. 41.
Figure 42B:
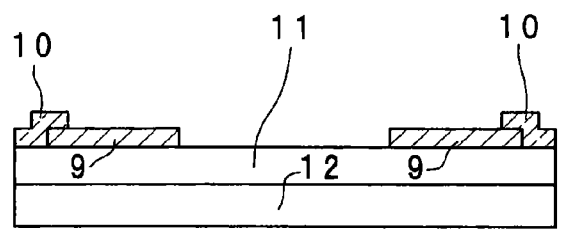
FIG. 42B is a cross-sectional view of the semiconductor device taken along line B-B' of FIG. 40.
Figure 42D:
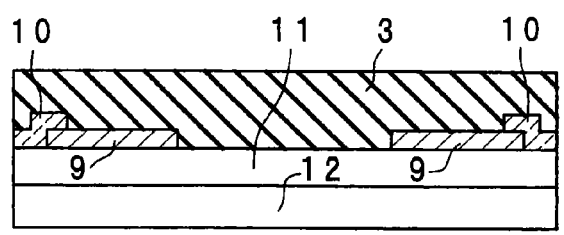
FIG. 42D is a cross-sectional view of the semiconductor device taken along line D-D' of FIG. 41.

FIG. 42A is a cross-sectional view of the semiconductor device taken along line A-A' of FIG. 40, FIG. 42B is a cross-sectional view of the semiconductor device taken along line B-B' of FIG. 40, FIG. 42C is a cross-sectional view of the semiconductor device taken along line C-C' of FIG. 41, and FIG. 42D is a cross-sectional view of the semiconductor device taken along line D-D' of FIG. 41. In FIGS. 42A, 42B, 42C and 42D, film bodies having the same functions as those shown in FIGS. 17A, 17B and 18 are given the same reference numerals.

Moreover, in the semiconductor device according to the invention, a structure may be used in which after the conductive wiring has been formed by using the circuit drawing system, the surface of the semiconductor device is protected with an insulative substance such as polyimide.

In addition, it is also possible to print chip information, i.e., various information such as technical specifications, quality, the positions of the chips within the wafer by employing the circuit drawing system used in the semiconductor device manufacturing system according to the invention.

The present invention is useful in the field of the manufacture of semiconductor devices because it is possible to easily form desired conductive wiring or insulative film in semiconductor devices.

What is claimed is:

1. A semiconductor device which is a high voltage integrated circuit device formed by integrating a power semiconductor device and a logic circuit on one chip, wherein conductive wiring, which is level-shift wiring electrically connecting the logic circuit formed inside a high-potential island isolation region and a high-withstand voltage switching element, is formed on a passivation film through drawing pattern printing process.

* * * * *